(12) United States Patent
Baek et al.

(10) Patent No.: US 10,700,307 B2
(45) Date of Patent: Jun. 30, 2020

(54) ORGANIC LIGHT EMITTING DISPLAY DEVICE AND METHOD OF MANUFACTURING ORGANIC LIGHT EMITTING DISPLAY DEVICE

(71) Applicant: SAMSUNG DISPLAY CO., LTD., Yongin-si, Gyeonggi-Do (KR)

(72) Inventors: Jongjun Baek, Seoul (KR); Yoonho Khang, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/040,308

(22) Filed: Jul. 19, 2018

(65) Prior Publication Data
US 2019/0131573 A1 May 2, 2019

(30) Foreign Application Priority Data
Oct. 30, 2017 (KR) .................. 10-2017-0142879

(51) Int. Cl.
| H01L 51/52 | (2006.01) |
| H01L 27/32 | (2006.01) |
| H01L 51/56 | (2006.01) |
| H01L 51/00 | (2006.01) |
| H01L 51/50 | (2006.01) |

(52) U.S. Cl.
CPC ........ *H01L 51/5256* (2013.01); *H01L 27/322* (2013.01); *H01L 27/3246* (2013.01); *H01L 27/3258* (2013.01); *H01L 51/0097* (2013.01); *H01L 51/5012* (2013.01); *H01L 51/5203* (2013.01); *H01L 51/5284* (2013.01); *H01L 51/56* (2013.01); *H01L 51/5253* (2013.01)

(58) Field of Classification Search
None
See application file for complete search history.

(56) References Cited

U.S. PATENT DOCUMENTS

| 2008/0151152 | A1* | 6/2008 | Yang | ................. G02F 1/133502 |
| | | | | 349/106 |
| 2013/0341651 | A1* | 12/2013 | Kim | .................... H01L 31/0232 |
| | | | | 257/84 |
| 2015/0137093 | A1* | 5/2015 | Yang | ................... H01L 27/3244 |
| | | | | 257/40 |
| 2015/0179812 | A1* | 6/2015 | Suzumura | .......... H01L 29/7869 |
| | | | | 257/43 |

(Continued)

FOREIGN PATENT DOCUMENTS

| JP | 2012-216592 | 11/2012 |
| JP | 2017-103254 | 6/2017 |
| KR | 1020120107350 | 10/2012 |

*Primary Examiner* — Shaun M Campbell
(74) *Attorney, Agent, or Firm* — F. Chau & Associates, LLC

(57) ABSTRACT

An organic light emitting display device includes a semiconductor element, a lower electrode, a light emitting layer, an upper electrode, an anti-reflection layer, and a thin film encapsulation structure. The semiconductor element is disposed on a substrate. The lower electrode is disposed on the semiconductor element. The light emitting layer is disposed on the lower electrode. The upper electrode is disposed on the light emitting layer. The anti-reflection layer is disposed on the upper electrode. The thin film encapsulation structure is disposed on the anti-reflection layer.

14 Claims, 15 Drawing Sheets

(56) References Cited

U.S. PATENT DOCUMENTS

| | | | |
|---|---|---|---|
| 2015/0198853 A1* | 7/2015 | Park | H01L 27/124 |
| | | | 349/137 |
| 2015/0317014 A1* | 11/2015 | Miyake | G06F 3/044 |
| | | | 345/174 |
| 2016/0233280 A1* | 8/2016 | Cheng | H01L 27/1218 |
| 2017/0145562 A1 | 5/2017 | Farquhar et al. | |
| 2018/0033642 A1* | 2/2018 | Lu | C23C 14/0073 |
| 2018/0151830 A1* | 5/2018 | Furuta | H01L 51/5225 |

* cited by examiner

ORGANIC LIGHT EMITTING DISPLAY DEVICE AND METHOD OF MANUFACTURING ORGANIC LIGHT EMITTING DISPLAY DEVICE

CROSS-REFERENCE TO RELATED APPLICATION(S)

This application claims priority under 35 USC § 119 from, and the benefit of, Korean Patent Applications No. 10-2017-0142879, filed on Oct. 30, 2017 in the Korean Intellectual Property Office (KIPO), the contents of which are herein incorporated by reference in their entirety.

BACKGROUND

1. Technical Field

Exemplary embodiments are directed generally to organic light emitting display devices and methods of manufacturing the organic light emitting display devices. More particularly, embodiments of the present inventive concept are directed to organic light emitting display devices that include an anti-reflection layer and methods of manufacturing the organic light emitting display devices that include the anti-reflection layer.

2. Discussion of the Related Art

A flat panel display (FPD) device is widely used as a display device of an electronic device because the FPD device is lightweight and thin compared to a cathode-ray tube (CRT) display device. Typical examples of a FPD device are a liquid crystal display (LCD) device and an organic light emitting display (OLED) device. Compared to an LCD device, an OLED device has many advantages, such as a higher luminance and a wider viewing angle. In addition, an OLED device can be made thinner because an OLED device does not require a backlight. In an OLED device, electrons and holes are injected into an organic thin layer through a cathode and an anode, and then recombined in the organic thin layer to generate excitons, which emit a light of a certain wavelength.

An OLED device includes a plurality of semiconductor elements, a plurality of capacitors, a plurality of light emitting structures, such as an anode electrode, a light emitting layer, a cathode electrode, etc. The semiconductor elements, the capacitors, and the light emitting structures include metal patterns, and the metal patterns reflect light that is externally incident into the OLED device. In this case, a visibility of the OLEO device can be reduced.

SUMMARY

Some exemplary embodiments can provide an organic light emitting display device that includes an anti-reflection layer.

Some exemplary embodiments can provide a method of manufacturing an organic light emitting display device that includes an anti-reflection layer.

According to some exemplary embodiments, an organic light emitting display (OLED) device includes a semiconductor element on a substrate, a lower electrode, a light emitting layer, an upper electrode, an anti-reflection layer, and a thin film encapsulation structure. The lower electrode is disposed on the semiconductor element. The light emitting layer is disposed on the lower electrode. The upper electrode is disposed on the light emitting layer. The anti-reflection layer is disposed on the upper electrode. The thin film encapsulation structure is disposed on the anti-reflection layer.

In exemplary embodiments, the anti-reflection layer may be disposed on the entire upper electrode.

In exemplary embodiments, the anti-reflection layer may have an opening that exposes the light emitting layer.

In exemplary embodiments, the anti-reflection layer may consist essentially of graphene.

In exemplary embodiments, the semiconductor element may include an active layer disposed on the substrate, a gate electrode disposed on the active layer, source and drain electrodes disposed on the gate electrode, a gate insulation layer disposed between the active layer and the gate electrode and an insulating interlayer disposed between the gate electrode and the source and drain electrodes.

In exemplary embodiments, the OLED device may further include a first anti-reflection pattern, a second anti-reflection pattern, and a third anti-reflection pattern. The first anti-reflection pattern may be disposed on the gate electrode and covers an upper surface of the gate electrode, and may be disposed on the upper surface of the gate electrode. The second anti-reflection pattern may be disposed on the source electrode and covers an upper surface of the source electrode, and may be disposed on the upper surface of the source electrode. The third anti-reflection pattern may be disposed on the drain electrode and covers an upper surface of the drain electrode, and may be disposed on the upper surface of the drain electrode. The first, second, and third anti-reflection patterns are not disposed on the gate insulation layer or the insulating interlayer.

In exemplary embodiments, the OLED device may further include a fourth anti-reflection pattern and a planarization layer. The fourth anti-reflection pattern may be disposed on the lower electrode and covers an upper surface of the lower electrode, and may be disposed on the upper surface of the lower electrode. The planarization layer is disposed between the semiconductor element and the lower electrode. The fourth anti-reflection pattern may not be disposed on the planarization layer.

In exemplary embodiments, the lower electrode may be in contact with the upper surface of the drain electrode via a contact hole formed by removing a portion of the planarization and may be electrically connected to the drain electrode. The third anti-reflection pattern may have an opening that exposes a portion of the upper surface of the drain electrode through the contact hole.

In exemplary embodiments, the first, second, third, and fourth anti-reflection patterns may consist essentially of graphene.

In exemplary embodiments, the OLEO device may further include a first gate electrode pattern, a fifth anti-reflection pattern, an electrode pattern, and a sixth anti-reflection pattern. The first gate electrode pattern may be disposed at the same layer as the gate electrode, and may be spaced apart from the gate electrode. The fifth anti-reflection pattern may be disposed on the first gate electrode pattern and cover an upper surface of the first gate electrode pattern, and may be disposed on the upper surface of the first gate electrode pattern. The electrode pattern may be disposed at the same layer as the source and drain electrodes, and may be spaced apart from the source and drain electrodes. The sixth anti-reflection pattern may be disposed on the electrode pattern and covers an upper surface of the electrode pattern, and may be disposed on the upper surface of the electrode pattern.

In exemplary embodiments, the thin film encapsulation structure may include a first thin film encapsulation layer, a second thin film encapsulation layer, and a third thin film encapsulation layer. The first thin film encapsulation layer may be disposed on the anti-reflection layer, and may include inorganic materials. The second thin film encapsulation layer may be disposed on the first thin film encapsulation layer, and may include organic materials. The third thin film encapsulation layer may be disposed on the second thin film encapsulation layer, and may include inorganic materials.

In exemplary embodiments, the substrate and the thin film encapsulation structure may include flexible materials.

According to some exemplary embodiments, a method of manufacturing an OLED device is provided as follows. A substrate is provided. An active layer is formed on the substrate. A gate electrode is formed on the active layer. A first anti-reflection pattern is formed on an upper surface of the gate electrode by performing a first selective deposition process. Source and drain electrodes are formed on the first anti-reflection pattern. Each of a second and a third anti-reflection pattern is formed on upper surfaces of the source and drain electrodes, respectively, by performing a second selective deposition process. A lower electrode is formed on the second and third anti-reflection patterns. A fourth anti-reflection pattern is formed on an upper surface of the lower electrode by performing a third selective deposition process. A light emitting layer is formed on the fourth anti-reflection pattern. An upper electrode is formed on the light emitting layer. An anti-reflection layer is formed on the upper electrode.

In exemplary embodiments, performing the first selective deposition process may include providing a gas that includes carbon and hydrogen in a plasma chemical vapor deposition process and forming a first graphene layer on the upper surface of the gate electrode. The gate electrode may include a catalytic metal. The first graphene layer may be the first anti-reflection pattern.

In exemplary embodiments, performing the second selective deposition process may include providing a gas that includes carbon and hydrogen in a plasma chemical vapor deposition process and simultaneously forming each of a second graphene layer and a third graphene layer on the upper surfaces of the source and drain electrodes, respectively. The source and drain electrodes may each include a catalytic metal. The second and third graphene layers may be the second and third anti-reflection patterns, respectively.

In exemplary embodiments, performing the third selective deposition process may include providing a gas that includes carbon and hydrogen in a plasma chemical vapor deposition process and forming a fourth graphene layer on the upper surface of the lower electrode. The lower electrode may include a catalytic metal. The fourth graphene layer may be the fourth anti-reflection pattern.

In exemplary embodiments, the method may further include forming a thin film encapsulation structure on the anti-reflection layer. The thin film encapsulation structure may include a first thin film encapsulation layer, a second thin film encapsulation layer, and a third thin film encapsulation layer. The first thin film encapsulation layer may be disposed on the anti-reflection layer, and may include inorganic materials. The second thin film encapsulation layer may be disposed on the first thin film encapsulation layer, and may include organic materials. The third thin film encapsulation layer may be disposed on the second thin film encapsulation layer, and may include inorganic materials.

According to some exemplary embodiments, an organic light emitting display (OLED) device includes a semiconductor element, a planarization layer, a lower electrode, a fourth anti-reflection pattern, a light emitting layer, and an upper electrode. The semiconductor element is disposed on a substrate. The planarization layer is disposed on the semiconductor element. The lower electrode is disposed on the planarization layer. The fourth anti-reflection pattern is disposed on the lower electrode and covers an upper surface of the lower electrode, the fourth anti-reflection pattern being disposed on the upper surface of the lower electrode. The fourth anti-reflection pattern is not disposed on the planarization layer, and the fourth anti-reflection pattern consists essentially of graphene. The light emitting layer is disposed on the fourth anti-reflection pattern. The upper electrode is disposed on the light emitting layer.

In exemplary embodiments, the semiconductor element may further include an active layer, a gate electrode, source and drain electrodes, a gate insulation layer, an insulating interlayer, and first to third anti-reflection patterns. The active layer is disposed on the substrate. The gate electrode is disposed on the active layer. The source and drain electrodes are disposed on the gate electrode. The gate insulation layer is disposed between the active layer and the gate electrode. The insulating interlayer is disposed between the gate electrode and the source and drain electrodes. The first anti-reflection pattern is disposed on the gate electrode and covers an upper surface of the gate electrode. The first anti-reflection pattern is disposed on the upper surface of the gate electrode. The second anti-reflection pattern is disposed on the source electrode and covers an upper surface of the source electrode. The second anti-reflection pattern is disposed on the upper surface of the source electrode. The third anti-reflection pattern is disposed on the drain electrode and covers an upper surface of the drain electrode. The third anti-reflection pattern is disposed on the upper surface of the drain electrode. The first, second, and third anti-reflection patterns are not disposed on the gate insulation layer or the insulating interlayer. The first, second, and third anti-reflection patterns may consist essentially of graphene.

In exemplary embodiments, the OLED device may further include a first gate electrode pattern, a fifth anti-reflection pattern, an electrode pattern, a sixth anti-reflection pattern and an anti-reflection layer. The first gate electrode pattern is disposed at the same layer as the gate electrode, the first gate electrode pattern being spaced apart from the gate electrode. The fifth anti-reflection pattern is disposed on the first gate electrode pattern and covers an upper surface of the first gate electrode pattern, the fifth anti-reflection pattern being disposed on the upper surface of the first gate electrode pattern. The electrode pattern is disposed at the same layer as the source and drain electrodes, the electrode pattern being spaced apart from the source and drain electrodes. The sixth anti-reflection pattern is disposed on the electrode pattern and covers an upper surface of the electrode pattern, the sixth anti-reflection pattern being disposed on the upper surface of the electrode pattern. The anti-reflection layer is on the upper electrode. The fifth and sixth anti-reflection patterns and the anti-reflection layer consist essentially of graphene.

As an OLEO device in accordance with exemplary embodiments includes first to sixth anti-reflection patterns and an anti-reflection layer, external reflections from metal patterns included in the OLED device can be reduced. In addition, since the first to sixth anti-reflection patterns and the anti-reflection layer consist essentially of graphene, the flexibility of the metal patterns can be increased, and the wiring resistance of the metal patterns can be reduced.

In a method of manufacturing the OLED device in accordance with exemplary embodiments, as the first to sixth anti-reflection patterns and the anti-reflection layer are formed on a metal pattern without a patterning process, a manufacturing cost of the OLED device can be reduced.

DETAILED DESCRIPTION OF EXEMPLARY EMBODIMENTS

Hereinafter, embodiments of the present inventive concept will be described in detail with reference to the accompanying drawings.

Figure 1:
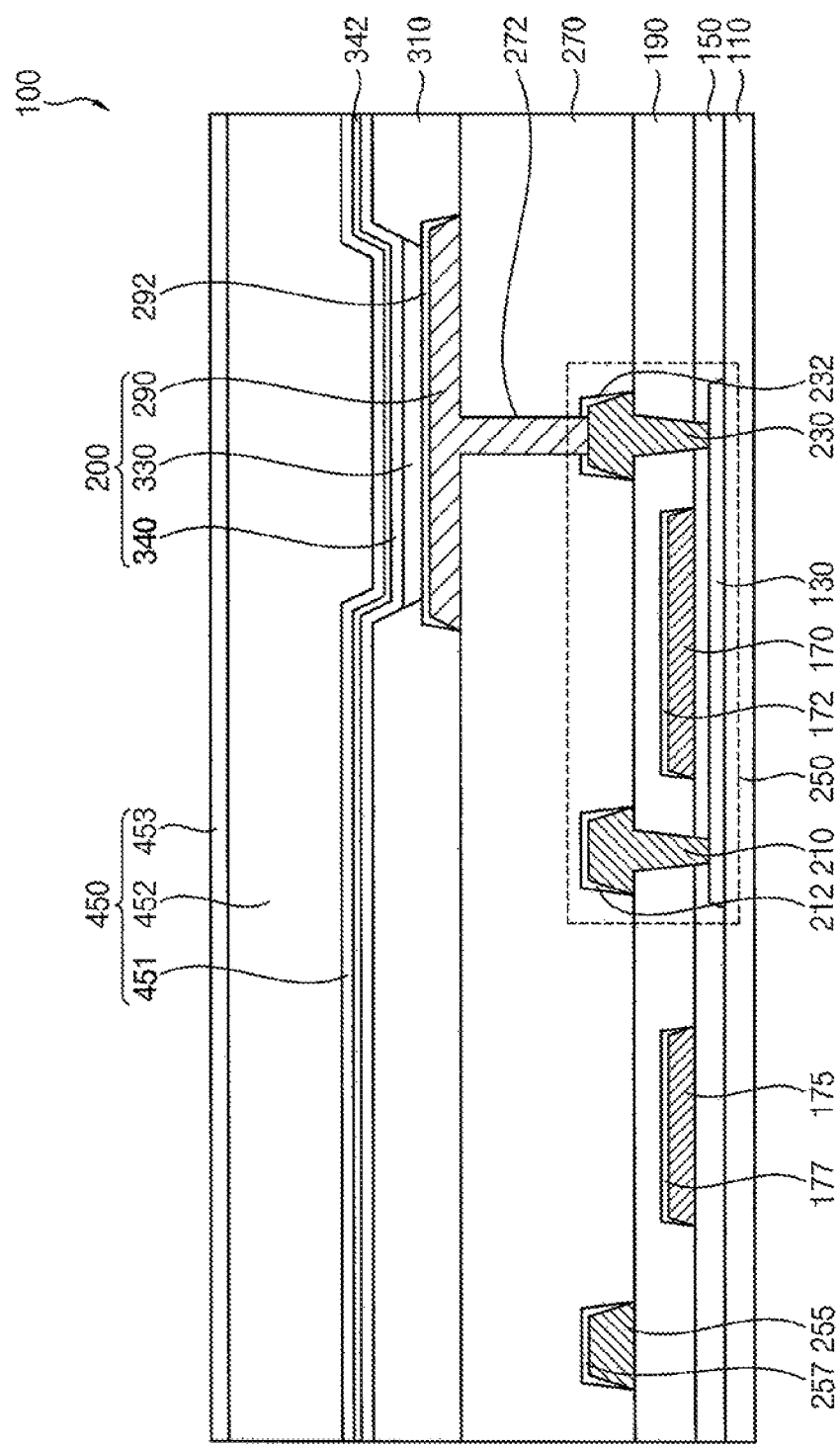
FIG. 1 is a cross sectional view of an organic light emitting display device in accordance with exemplary embodiments.

FIG. 1 is a cross sectional view of an organic light emitting display device in accordance with exemplary embodiments.

Referring to FIG. 1, an organic light emitting display (OLED) device 100 according to an exemplary embodiment includes a substrate 110, a semiconductor element 250, a first anti-reflection pattern 172, a second anti-reflection pattern 212, a third anti-reflection pattern 232, a first gate electrode pattern 175, a fifth anti-reflection pattern 177, an electrode pattern 255, a sixth anti-reflection pattern 257, a planarization layer 270, a pixel defining layer 310, a light emitting structure 200, a fourth anti-reflection pattern 292, an anti-reflection layer 342, a thin film encapsulation (TFE) structure 450, etc. Here, the semiconductor element 250 includes an active layer 130, a gate insulation layer 150, a gate electrode 170, an insulating interlayer 190, a source electrode 210, and a drain electrode 230, and the light emitting structure 200 includes a lower electrode 290, a light emitting layer 330, and an upper electrode 340. In addition, the TEE structure 450 includes a first TFE layer 451, a second TFE layer 452, and a third TFE layer 453. As the OLED device 100 includes the first through sixth anti-reflection patterns 172, 212, 232, 292, 177, and 257 and the anti-reflection layer 342, the OLED device 100 can reduce reflections of external light.

According to an embodiment, the substrate 110 may include transparent or opaque insulation materials. The substrate 110 includes a flexible transparent resin substrate. In exemplary embodiments, the substrate 110 has a structure in which a first organic layer, a first barrier layer, a second organic layer, and a second barrier layer are sequentially stacked. The first barrier layer and the second barrier layer each include inorganic materials such as silicon oxide, etc. In addition, the first organic layer and the second organic layer each include organic materials such as a polyamide-based resin. In exemplary embodiments, each of the first and second barrier layers block moisture or water that has permeated through the first and second organic layers.

According to an embodiment, since the substrate 110 is relatively thin and flexible, the substrate 110 is disposed on a rigid glass substrate to help support the formation of the semiconductor element 250 and the light emitting structure 200. When manufacturing the LED device 100, after an insulation layer, such as a buffer layer, is formed on the second barrier layer of the substrate 110, the semiconductor element 250 and the light emitting structure 200 are disposed on the insulation layer. After the semiconductor element 250 and the light emitting structure 200 are formed on the insulation layer, the rigid glass substrate on which the substrate 110 is disposed is removed. It can be challenging to directly form the semiconductor element 250 and the light emitting structure 200 on the substrate 110 because the substrate 110 is relatively thin and flexible. Accordingly, the semiconductor element 250 and the light emitting structure 200 are formed on the substrate 110 and the rigid glass substrate, and then the substrate 110 can serve as the substrate of the OLED device 100 after the removal of the rigid glass substrate. Alternatively, the substrate 110 may include a quartz substrate, a synthetic quartz substrate, a calcium fluoride substrate, a fluoride-doped quartz substrate, a sodalime glass substrate, a non-alkali glass substrate, etc.

In exemplary embodiments, the substrate 110 includes four-layers, but embodiments are not limited thereto. For example, in some exemplary embodiments, the substrate 110 may include a single layer or a plurality of layers.

According to an embodiment, a buffer layer is disposed on the substrate 110. The buffer layer prevents metal atoms and/or impurities from diffusing from the substrate 110 into the semiconductor element 250. In addition, the buffer layer can control a rate of a heat transfer in a crystallization process that forms the active layer 130, to obtain a substantially uniform active layer. Further, the buffer layer can improve the surface flatness of the substrate 110 if the surface of the substrate 110 is irregular. In some exemplary embodiments, based on the type of the substrate 110, at least two buffer layers can be disposed on the substrate 110, or no buffer layer is disposed. The buffer layer may include a silicon compound, a metal oxide, etc.

According to an embodiment, the active layer 130 is disposed on the substrate 110.

The active layer 130 may include an oxide semiconductor, an inorganic semiconductor such as amorphous silicon, polysilicon, etc., an organic semiconductor, etc.

According to an embodiment, the gate insulation layer 150 is disposed on the active layer 130. The gate insulation layer 150 covers the active layer 130 on the substrate 110, and is disposed on the entire substrate 110. According to some embodiments, the gate insulation layer 150 has a substantially flat upper surface without a step around the active layer 130. Alternatively, in other embodiments, the gate insulation layer 150 has a substantially uniform thickness along a profile of the active layer 130. The gate insulation layer 150 may include a silicon compound, a metal oxide, etc. For example, the gate insulation layer 150 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc.

According to an embodiment, the gate electrode 170 is disposed on the gate insulation layer 150. The gate electrode 170 is disposed on a portion of the gate insulation layer 150 under which the active layer 130 is located. The gate electrode 170 may include a metal, a metal alloy, a metal nitride, a conductive metal oxide, a transparent conductive materials, etc. For example, the gate electrode 170 may include gold (Au), sifter (Ag), aluminum (Al), platinum (Pt), nickel (Ni), titanium (Ti), palladium (Pd), magnesium (Mg), Calcium (Ca), Lithium (Li), chrome (Cr), tantalum (Ta), tungsten (W), copper (Cu), molybdenum (Mo), scandium (Sc), neodymium (Nd), Iridium (Ir), an alloy of aluminum, aluminum nitride (AlNx), an alloy of silver, tungsten nitride (WNx), an alloy of copper, an alloy of molybdenum, titanium nitride (TiNx), chrome nitride (CrNx), tantalum nitride (TaNx), strontium ruthenium oxide (SRO), zinc oxide (ZnOx), indium tin oxide (ITO), stannum oxide (SnOx), indium oxide (InOx), gallium oxide (GaOx), indium zinc oxide (IZO), etc. These may be used alone or in a suitable combination thereof. In some exemplary embodiments, the gate electrode 170 has a multi-layered structure.

According to an embodiment, the first gate electrode pattern 175 is disposed on the gate insulation layer 150, and is spaced apart from the gate electrode 170. The first gate electrode pattern 175 serves as a wiring. For example, the first gate electrode pattern 175 may be data signal wiring through which a data signal is transmitted, gate signal wiring through which a gate signal is transmitted, initialization signal wiring through which an initialization signal is transmitted, light emission signal wiring through which a light emission signal is transmitted, power supply voltage wiring through which a power supply voltage is transmitted, etc. In exemplary embodiments, the first gate electrode pattern 175 and the gate electrode 170 are disposed at the same layer, and are simultaneously or concurrently formed using the same materials. The first gate electrode pattern 175 may include a metal, a metal alloy, a metal nitride, a conductive metal oxide, a transparent conductive material, etc. These may be used alone or in a suitable combination thereof. In some exemplary embodiments, the first gate electrode pattern 175 has a multi-layered structure.

According to an embodiment, the first anti-reflection pattern 172 is disposed on the gate electrode 170. The first anti-reflection pattern 172 covers an upper snake of the gate electrode 170. In exemplary embodiments, the first anti-reflection pattern 172 is disposed only on the upper surface, such as an upper portion and both lateral portions of the gate electrode 170. In other words, the first anti-reflection pattern 172 completely covers the gate electrode 170 so that the first anti-reflection pattern 172 does not expose the gate electrode 170, and the first anti-reflection pattern 172 is not disposed on the gate insulation layer 150. In addition, the reflection of external light from the gate electrode 170 can be reduced by controlling or adjusting a thickness of the first anti-reflection pattern 172. For example, when the first anti-reflection pattern 172 has a predetermined thickness on the gate electrode 170, a reflectivity of the gate electrode 170 can be reduced by changing a path of the external light incident into the first anti-refection pattern 172. The first anti-reflection pattern 172 includes materials that can change the path of the external light incident into the first anti-reflection pattern 172. In exemplary embodiments, the first anti-reflection pattern 172 consists essentially of graphene. When the first anti-reflection pattern 172 includes graphene, the first anti-reflection pattern 172 increases the flexibility of the gate electrode 170 and decreases the wiring resistance of the gate electrode 170. In exemplary embodiments, the graphene may have a single layer or a plurality of layers.

For example, according to an embodiment, in a process that forms a conventional anti-reflection layer, after a preliminary anti-reflection layer is formed on an entire preliminary electrode layer, an electrode layer and an anti-reflection layer are formed on the electrode by performing an etching process. In this case, the anti-reflection layer does not cover lateral portions of the electrode layer, and external light can be reflected from the lateral portions of the electrode layer. Otherwise, a preliminary anti-reflection layer is formed on the entire electrode layer after an electrode layer is formed, and an anti-reflection layer is formed by performing a photo process and a patterning process using a photoresist, which increases the number of a mask processes. In this case, a manufacturing cost of the OLED device increases.

According to an embodiment, the fifth anti-reflection pattern 177 is disposed on the first gate electrode pattern 175. The fifth anti-reflection pattern 177 covers an upper surface of the first gate electrode pattern 175. In exemplary embodiments, the fifth anti-reflection pattern 177 is disposed on the upper surface, such as an upper portion and both lateral portions of the first gate electrode pattern 175. In other words, the fifth anti-reflection pattern 177 completely covers the first gate electrode pattern 175 so that the fifth anti-reflection pattern 177 does not expose the first gate electrode pattern 175, and the fifth anti-reflection pattern 177 is not disposed on the gate insulation layer 150. In addition, reflection of external light from the first gate electrode pattern 175 can be reduced by controlling a thickness of the fifth anti-reflection pattern 177.

According to an embodiment, the fifth anti-reflection pattern 177 includes materials that can change the path of external light incident into the fifth anti-reflection pattern 177. In exemplary embodiments, the fifth anti-reflection pattern 177 consists essentially of graphene. When the fifth anti-reflection pattern. 177 includes graphene, the fifth anti-reflection pattern 177 increases the flexibility of the first gate electrode pattern 175 and decreases the wiring resistance of the first gate electrode pattern 175. In exemplary embodiments, the grapheme may have a single layer or a plurality of layers.

According to an embodiment, the insulating interlayer 190 is disposed on the first anti-reflection pattern 172 and the fifth anti-reflection pattern 177. The insulating interlayer 190 covers the first anti-reflection pattern 172 and the fifth anti-reflection pattern 177 on the gate insulation layer 150, and is disposed on the entire gate insulation layer 150. According to some embodiments, the insulating interlayer 190 has a substantially flat upper surface without a step around the first and fifth anti-reflection patterns 172 and 177. Alternatively, in other embodiments, the insulating interlayer 190 has a substantially uniform thickness along a profile of the first and fifth anti-reflection patterns 172 and 177. The insulating interlayer 190 may include a silicon compound, a metal oxide, etc.

According to an embodiment, the source electrode 210 and the drain electrode 230 are disposed on the insulating interlayer 190. The source electrode 210 is in direct contact with a source region of the active layer 130 via a contact hole formed by removing a portion of the gate insulation layer 150 and the insulating interlayer 190. The drain electrode 230 is in direct contact with a drain region of the active layer 130 via a contact hole formed by removing another portion of the gate insulation layer 150 and the insulating interlayer 190. Each of the source electrode 210 and the drain electrode 230 includes a metal, an alloy, a metal nitride, a conductive metal oxide, a transparent conductive material, etc. These may be used alone or in a suitable combination thereof. In some exemplary embodiments, each of the source and drain electrodes 210 and 230 has a multi-layered structure. Accordingly, the semiconductor element 250, including the active layer 130, the gate insulation layer 150, the gate electrode 170, the insulating interlayer 190, the source electrode 210, and the drain electrode 230, is formed.

In exemplary embodiments, the semiconductor element 250 has a top gate structure, but embodiments are not limited thereto. For example, in some exemplary embodiments, the semiconductor element 250 has a bottom gate structure or a double gate structure.

According to an embodiment, the electrode pattern 255 is disposed on the insulating interlayer 190, and is spaced apart from the source electrode 210 and the drain electrode 230. The electrode pattern 255 serves as a wiring. For example, the electrode pattern 255 may be data signal wiring through which a data signal is transmitted, gate signal wiring through which a gate signal is transmitted, initialization signal wiring through which an initialization signal is transmitted, light emission signal wiring through which a light emission signal is transmitted, power supply voltage wiring through which a power supply voltage is transmitted, etc. In exemplary embodiments, the electrode pattern 255, the source electrode 210, and the drain electrode 230 are disposed at the same layer, and are simultaneously formed using the same materials. The electrode pattern 255 may include a metal, a metal alloy, a metal nitride, a conductive metal oxide, a transparent conductive material, etc. These may be used alone or in a suitable combination thereof. In some exemplary embodiments, the electrode pattern 255 has a multi-layered structure.

According to an embodiment, the second anti-reflection pattern 212 is disposed on the source electrode 210. The second anti-reflection pattern 212 covers an upper surface of the source electrode 210. In exemplary embodiments, the second anti-reflection pattern 212 is disposed on the upper surface, such as an upper portion and both lateral portions of the source electrode 210. In other words, the second anti-reflection pattern 212 completely covers the source electrode 210 so that the second anti-reflection pattern 212 does not expose the source electrode 210, and the second anti-reflection pattern 212 is not disposed on the insulating interlayer 190. In addition, the reflection of external light from the source electrode 210 can be reduced by controlling a thickness of the second anti-reflection pattern 212. The second anti-reflection pattern 212 include materials that can change the path of external light incident into the second anti-reflection pattern 212. In exemplary embodiments, the second anti-reflection pattern 212 consists essentially of graphene. When the second anti-reflection pattern 212 includes graphene, the second anti-reflection pattern 212 increases the flexibility of the source electrode 210 and decreases the wiring resistance of the source electrode 210. In exemplary embodiments, the graphene may have a single layer or a plurality of layers.

The third anti-reflection pattern 232 may be disposed on the drain electrode 230. The third anti-reflection pattern 232 may cover an upper surface of the drain electrode 230. In exemplary embodiments, the third anti-reflection pattern 232 is disposed on the upper surface, such as an upper portion and both lateral portions of the drain electrode 230. In other words, the third anti-reflection pattern 232 completely covers the drain electrode 230 so that the third anti-reflection pattern 232 does not expose the drain electrode 230, and the third anti-reflection pattern 232 is not disposed on the insulating interlayer 190. According to an embodiment, the third anti-reflection pattern 232 has an opening that exposes a portion of the upper surface of the drain electrode 230 due to a contact hole 272 formed by removing a portion of the planarization layer 270. In addition, the reflection of external light from the drain electrode 230 can be reduced by controlling the thickness of the third anti-reflection pattern 232. The third anti-reflection pattern 232 includes materials that can change the path of external light incident into the third anti-reflection pattern 232. In exemplary embodiments, the third anti-reflection pattern 232 consists essentially of graphene. When the third anti-reflection pattern 232 includes graphene, the third anti-reflection pattern 232 increases the flexibility of the drain electrode 230 and decreases the wiring resistance of the drain electrode 230. In exemplary embodiments, the graphene may have a single layer or a plurality of layers.

According to an embodiment, the sixth anti-reflection pattern 257 is disposed on the electrode pattern 255. The sixth anti-reflection pattern 257 covers an upper surface of the electrode pattern 255. In exemplary embodiments, the sixth anti-reflection pattern 257 is disposed on the upper surface, such as an upper portion and both lateral portions of the electrode pattern 255. In other words, the sixth anti-reflection pattern 257 completely covers the electrode pattern 255 so that the sixth anti-reflection pattern 257 does not expose the electrode pattern 255, and the sixth anti-reflection pattern 257 is not disposed on the insulating interlayer 190. In addition, the reflection of external light from the electrode pattern 255 can be reduced by controlling the thickness of the sixth anti-reflection pattern 257. The sixth anti-reflection pattern 257 includes materials that can change the path of external light incident into the sixth anti-reflection pattern 257. In exemplary embodiments, the sixth anti-reflection pattern 257 consists essentially of graphene. When the sixth anti-reflection pattern 257 includes graphene, the sixth anti-reflection pattern 257 increases the flexibility of the electrode pattern 255 and decreases the wiring resistance of the electrode pattern 255. In exemplary embodiments, the graphene may have a single layer or a plurality of layers.

According to an embodiment, the planarization layer 270 is disposed on the second anti-reflection pattern 212, the third anti-reflection pattern 232, and the sixth anti-reflection pattern 257. The planarization layer 270 may covers the second, third, and sixth anti-reflection patterns 212, 232, and 257, and is disposed on the entire insulating interlayer 190. The planarization layer 270 is sufficiently thick to cover the second, third, and sixth anti-reflection patterns 212, 232, and 257 on the insulating interlayer 190. In this case, the planarization layer 270 has a substantially flat upper surface, and a planarization process is further performed on the planarization layer 270 to flatten the upper surface of the planarization layer 270. In exemplary embodiments, the planarization layer 270 has the contact hole 272 formed by removing a portion of the planarization layer 270. A portion of the upper surface of the drain electrode 230 is exposed via the contact hole 272. The planarization layer 270 may include organic materials or inorganic materials. In exemplary embodiments, the planarization layer 270 includes organic materials such as polyimide, an epoxy-based resin, an acryl-based resin, polyester, a photoresist, a polyacryl-based resin, a polyimide-based resin, a polyimide-based resin, a siloxane-based resin, etc.

According to an embodiment, the lower electrode 290 is disposed on the planarization layer 270. The lower electrode 290 is disposed on a portion of the planarization layer 270 under which the semiconductor element 250 is located, and is in contact with the drain electrode 230 via the contact hole 272 of the planarization layer 270. In addition, the lower electrode 290 is electrically connected to the semiconductor element 250. The lower electrode 290 may include a metal, a metal alloy, a metal nitride, a conductive metal oxide, a transparent conductive material, etc. These may be used alone or in a suitable combination thereof. In some exemplary embodiments, the lower electrode 290 has a multi-layered structure.

According to an embodiment, the fourth anti-reflection pattern 292 is disposed on the lower electrode 290. The fourth anti-reflection pattern 292 covers an upper surface of the lower electrode 290. In exemplary embodiments, the fourth anti-reflection pattern 292 is disposed only on the upper surface, such as an upper portion and both lateral portions of the lower electrode 290. In other words, the fourth anti-reflection pattern 292 completely covers the lower electrode 290 so that the fourth anti-reflection pattern 292 does not expose the lower electrode 290, and the fourth anti-reflection pattern 292 is not disposed on the planarization layer 270. In addition, the reflection of external light from the lower electrode 290 can be reduced by controlling a thickness of the fourth anti-reflection pattern 292. The fourth anti-reflection pattern 292 includes materials that can change the path of external light incident into the fourth anti-reflection pattern 292. In exemplary embodiments, the fourth anti-reflection pattern 292 consists essentially of graphene. When the fourth anti-reflection pattern 292 includes graphene, the fourth anti-reflection pattern 292 increases the flexibility of the lower electrode 290 and decreases the wiring resistance of the lower electrode 290. In exemplary embodiments, the graphene may have a single layer or a plurality of layers.

According to an embodiment, the pixel defining layer 310 is disposed on a portion of the fourth anti-reflection pattern 292 and the planarization layer 270, and covers both lateral portions of the fourth anti-reflection pattern 292 and exposes an upper portion of the fourth anti-reflection pattern 292. The pixel defining layer 310 may include organic materials or inorganic materials. In exemplary embodiments, the pixel defining layer 310 includes organic materials.

According to an embodiment, the light emitting layer 330 is disposed on the fourth anti-reflection pattern 292 exposed by the pixel defining layer 310. According to some embodiments, the light emitting layer 330 is formed using at least one light emitting material that can generate different colors of light, such as red, blue, or green, that correspond to different sub-pixels. Alternatively, according to other embodiments, the light emitting layer 330 generates a white light by stacking a plurality of light emitting materials that emit different colors, such as red, green, or blue. A color filter is disposed on the light emitting layer 330 to overlap the light emitting layer 330 on an upper surface of the TFE structure 450. The color filter may include at least one of a red filter, a green filter, or a blue filter. Alternatively, according to still other embodiments, the color filter includes at least one of a yellow filter, a cyan filter, or a magenta filter. The color filter includes a photosensitive resin or a color photoresist, etc.

According to an embodiment, the upper electrode 340 is disposed on the pixel defining layer 310 and the light emitting layer 330. The upper electrode 340 covers the light emitting layer 330 and the pixel defining layer 310, and is disposed on the entire light emitting layer 330 and the entire pixel defining layer 310. The upper electrode 340 may include a metal, a metal alloy, a metal nitride, a conductive metal oxide, a transparent conductive material, etc. These may be used alone or in a suitable combination thereof. In some exemplary embodiments, the upper electrode 340 has a multi-layered structure. Accordingly, the light emitting structure 200, including the lower electrode 290, the light emitting layer 330, and the upper electrode 340, is formed.

According to an embodiment, the anti-reflection layer 342 is disposed on the upper electrode 340. The anti-reflection layer 342 covers an upper surface of the upper electrode 340, and is disposed on the entire upper electrode 340. In other words, the anti-reflection layer 342 completely covers the upper electrode 340 so that the anti-refection layer 342 does not expose the upper electrode 340. In addition, the reflection of external light from the upper electrode 340 can be reduced by controlling a thickness of the anti-reflection layer 342. The anti-reflection layer 342 includes materials that can change the path of external light incident into the anti-reflection layer 342. In exemplary embodiments, the anti-reflection layer 342 consists essentially of graphene. When the anti-reflection layer 342 includes graphene, the anti-reflection layer 342 increase the flexibility of the upper electrode 340 and decreases a wiring resistance of the upper electrode 340. In exemplary embodiments, the graphene may have a single layer or a plurality of layers.

According to an embodiment, the first TFE layer 451 is disposed on the anti-reflection layer 342. The first TFE layer 451 covers the anti-reflection layer 342, and has a substantially uniform thickness along a profile of the anti-reflection layer 342. The first TFE layer 451 prevents the light emitting structure 200 from deteriorating due to the permeation of moisture, water, oxygen, etc. In addition, the first TFE layer 451 protects the light emitting structure 200 from external impacts. The first TFE layer 451 includes a flexible inorganic material.

According to an embodiment, the second TFE layer 452 is disposed on the first TFE layer 451. The second TFE layer 452 flattens of the OLED device 100, and protects the light emitting structure 200. The second TFE layer 452 includes a flexible organic material.

According to an embodiment, the third TFE layer 453 is disposed on the second TFE layer 452. The third TFE layer 453 covers the second TFE layer 452, and has a substantially uniform thickness along a profile of the second TFE layer 452. The third TFE layer 453 together with the first TFE layer 451 and the second TFE layer 452 can prevent deterioration of the light emitting structure 200 due to the permeation of moisture, water, oxygen, etc. In addition, the third TFE layer 453 together with the first TFE layer 451 and the second TFE layer 452 protect the light emitting structure 200 front external impacts. The third TFE layer 453 includes a flexible inorganic material. Accordingly, the TFE structure 450, including the first TFE layer 451, the second TFE layer 452, and the third TFE layer 453, is formed.

Alternatively, according to other embodiments, the TFE structure 450 may have a five layer structure in which first to fifth TFE layers are stacked or a seven layer structure in which the first to seventh TFE layers are stacked.

In some exemplary embodiments, the TFE structure 450 includes a quartz substrate, a synthetic quartz substrate, a calcium fluoride substrate, a fluoride-doped quartz substrate, a sodalime glass substrate, a non-alkali glass substrate, etc.

According to an embodiment, as the OLED device 100 in accordance with exemplary embodiments includes the first to sixth anti-reflection patterns 172, 212, 232, 292, 177, and 257 and the anti-reflection layer 342, external reflections from metal patterns, such as the gate electrode 170, the first gate electrode pattern 175, the source electrode 210, the drain electrode 230, the electrode pattern 255, the lower electrode 290, and the upper electrode 340, included in the OLED device 100 are reduced. In addition, since the first to sixth anti-reflection patterns 172, 212, 232, 292, 177, and 257 and the anti-reflection layer 342 consist essentially of graphene, the flexibility of the metal patterns is increased, and the wiring resistance of the metal patterns is reduced.

According to an embodiment, transparency, failure strain, and sheet resistance values can be calculated for the case in which ITO or graphene is formed on a metal pattern. The calculated values are shown in Table 1 below.

TABLE 1

|  | ITO | Graphene |
| --- | --- | --- |
| Thickness (nm) | — | 0.34 nm/layer |
| Transparency (%) | >90%/100 nm | 97%/1 layer |
| Failure strain (%) | 1.4 | >18 |
| Sheet resistance (Ω/sq) | <50/T = 90% | 30/T = 90% |

According to an embodiment, as shown in Table 1, when graphene is formed on a metal pattern, light incident into the graphene increases because transparency is increased, and the reflectivity of the metal pattern is reduced by changing a path of the light incident into the graphene. In addition, as failure strain is increased, the flexibility of the metal pattern is increased. Further, as the sheet resistance is reduced, the wiring resistance of the metal pattern is reduced.

FIGS. 2, 3, 4, 5, 6, 7, 8, 9, 10, 11, 12, 13, and 14 are cross-sectional views that illustrate a method of manufacturing a semiconductor element in accordance with exemplary embodiments.

Figure 2:
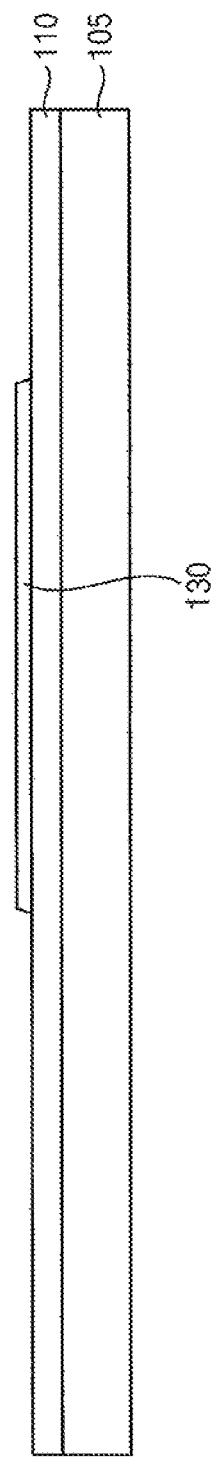
FIGS. 2, 3, 4, 5, 6, 7, 8, 9, 10, 11, 12, 13, and 14 are cross-sectional views that illustrate a method of manufacturing a semiconductor element in accordance with exemplary embodiments.

Referring to FIG. 2, according to an embodiment, a rigid glass substrate 105 is provided. A substrate 110 that include transparent or opaque materials is formed on the rigid glass substrate 105. The substrate 110 is formed using a flexible transparent material such as a flexible transparent resin substrate. In exemplary embodiments, the substrate 110 has a structure in which a first organic layer, a first barrier film layer, a second organic layer, and a second barrier film layer are sequentially stacked. The first and second barrier film layers are formed using inorganic materials, and the first and second organic layers are formed using organic materials. For example, each of the first and second barrier film layers includes silicon oxide, and can block water, moisture, etc, from permeating through the first and second organic layers. Further, each of the first and second organic layers includes a polyimide-based resin.

According to an embodiment, a buffer layer is formed on the substrate 110. The buffer layer is formed on the entire substrate 110. The buffer layer prevents metal atoms and/or impurities from diffusing from the substrate 110 into a semiconductor element. In addition, the buffer layer controls heat transfer in a crystallization process that forms the active layer, so that a substantially uniform active layer can be obtained. Further, the buffer layer flattens the substrate 110 when a surface of the substrate 110 is irregular. Based on the type of the substrate 110, at least two buffer layers can be disposed on the substrate 110, or no buffer layer is disposed. The buffer layer may be formed using a silicon compound, a metal oxide, etc.

According to an embodiment, an active layer 130 is formed on the substrate 110. The active layer 130 is formed using an oxide semiconductor, an inorganic semiconductor, an organic semiconductor, etc.

Figure 3:
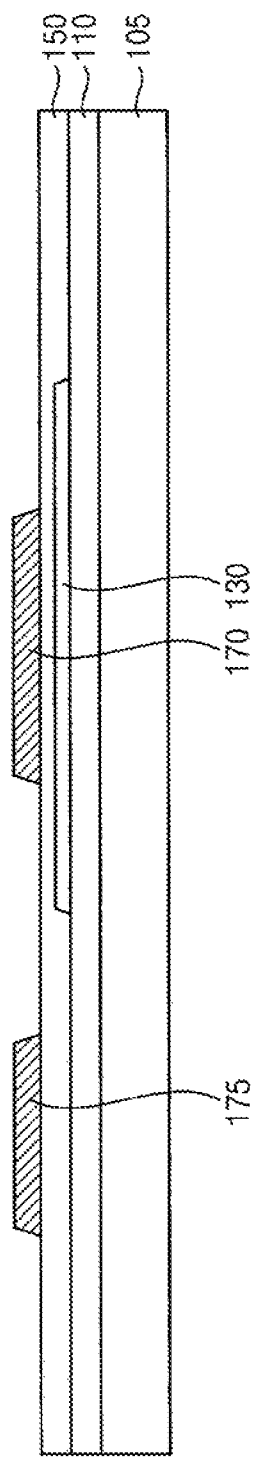

Referring to FIG. 3, according to an embodiment, a gate insulation layer 150 is formed on the active layer 130. The gate insulation layer 150 covers the active layer 130 on the substrate 110, and is formed on the entire substrate 110. For example, the gate insulation layer 150 is sufficiently thick to cover the active layer 130 on the substrate 110 and have a substantially flat upper surface without a step around the active layer 130. Alternatively, the gate insulation layer 150 covers the active layer 130 on the substrate 110 with a substantially uniform thickness along a profile of the active layer 130. The gate insulation layer 150 is formed using a silicon compound, a metal oxide, etc. For example, the gate insulation layer 150 may include SiOx, SiNx, SiOxNy, SiOxCy, SiCxNy, AlOx, AlNx, TaOx, HfOx, ZrOx, TiOx, etc.

According to an embodiment, a gate electrode 170 is formed on the gate insulation layer 150. The gate electrode 170 is formed on a portion of the gate insulation layer 150 under which the active layer 130 is located. The gate electrode 170 may be formed using a metal, a metal alloy, a metal nitride, a conductive metal oxide, a transparent conductive material, etc. For example, the gate electrode 170 may include Au, Ag, Al, Pt, Ni, Ti, Pd, Mg, Ca, Li, Cr, Ta, W, Cu, Mo, Sc, Nd, Ir, an alloy of aluminum, AlNx, an alloy of silver, WNx, an alloy of copper, an alloy of molybdenum, TiNx, CrNx, TaNx, SRO, ZnOx, ITO, SnOx, InOx, GaOx, IZO, etc. These may be used alone or in a suitable combination thereof. In some exemplary embodiments, the gate electrode 170 has a multi-layered structure.

According to an embodiment, a first gate electrode pattern 175 is formed on the gate insulation layer 150, and is spaced apart from the gate electrode 170. The first gate electrode pattern 175 serves as a wiring. In exemplary embodiments, the first gate electrode pattern 175 and the gate electrode 170 are disposed at the same layer, and are simultaneously formed using the same materials.

For example, according to an embodiment, after a preliminary gate electrode layer is formed on the gate insulation layer 150, the gate electrode 170 and the first gate electrode pattern 175 are formed on the gate insulation layer 150 by selectively etching the preliminary gate electrode layer. The first gate electrode pattern 175 is formed using a metal, a metal alloy, a metal nitride, a conductive metal oxide, a transparent conductive material, etc. These may be used alone or in a suitable combination thereof. In some exemplary embodiments, the first gate electrode pattern 175 has a multi-layered structure.

Figure 4:
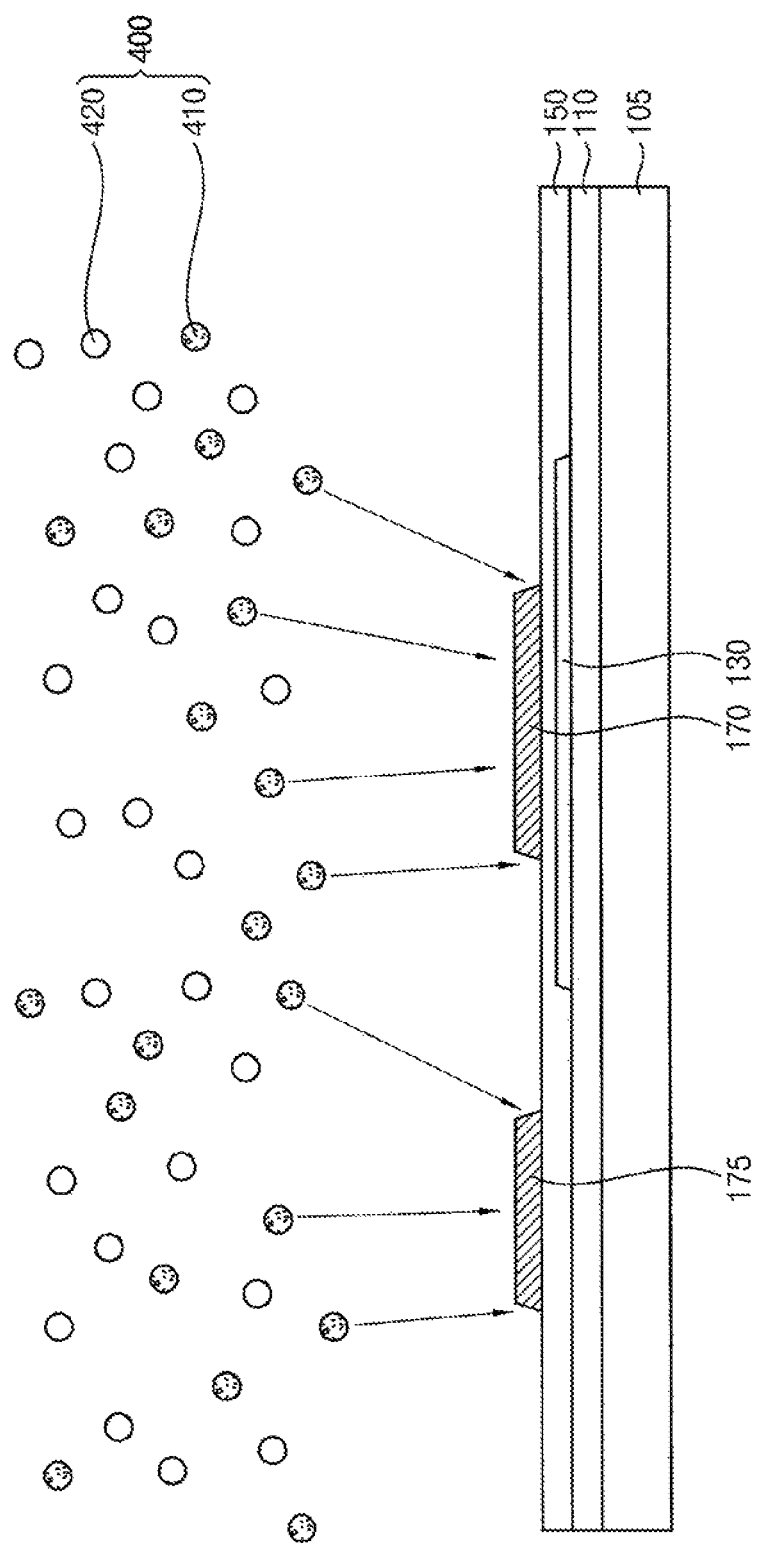

Referring to FIG. 4, according to an embodiment, a first selective etching deposition process, such as a plasma-enhanced chemical vapor deposition (PECVD) process, is performed. For example, a heat treatment process is performed in a chamber on the gate electrode 170 and the first gate electrode pattern 175, and the gate electrode 170 and the first gate electrode pattern 175 are catalytic metals. A gas 400 that includes a first material 410 and a second material 420 is injected into the chamber at the same time as the heat treatment process. In exemplary embodiments, the first material 410 includes methane $CH_4$, and the second material 420 includes hydrogen $H_2$. After the gas 400 is injected into the chamber, the first material 410 and the second material 420 react in the chamber after which carbon is deposited on the catalytic metal. For example, a first graphene layer is formed on an upper surface, such as an upper portion and both lateral portions of the gate electrode 170, and a fifth graphene layer is formed on an upper surface, such as an upper portion and both lateral portions of the first gate electrode pattern 175.

Figure 5:
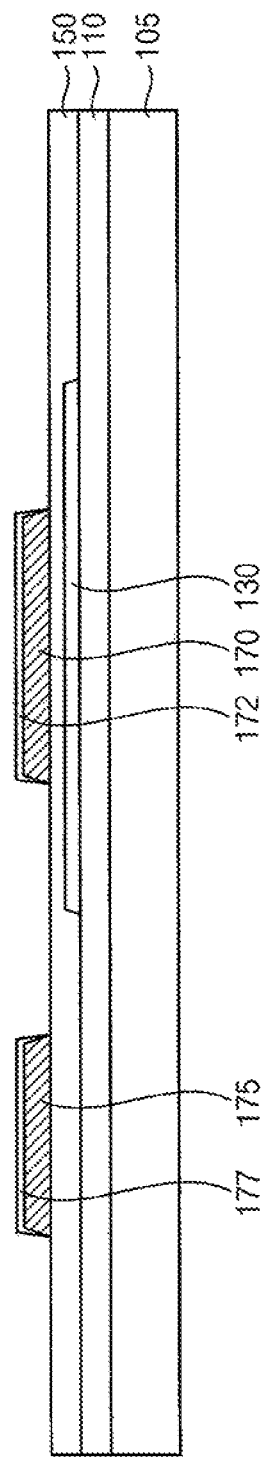

Referring to FIG. 5, according to an embodiment, a first anti-reflection pattern 172 is formed on the gate electrode 170. Here, the first graphene layer is the first anti-reflection pattern 172. The first anti-reflection pattern 172 covers the upper surface of the gate electrode 170. In exemplary embodiments, the first anti-reflection pattern 172 completely covers the gate electrode 170 so that the first anti-reflection pattern 172 does not expose the gate electrode 170, and the first anti-reflection pattern 172 is not formed on the gate insulation layer 150. In addition, the first anti-reflection pattern 172 consists essentially of graphene. Further, the first anti-reflection pattern 172 may have a single layer or a plurality of layers.

According to an embodiment, a fifth anti-reflection pattern 177 is formed on the first gate electrode pattern 175. Here, the fifth graphene layer is the fifth anti-reflection pattern 177. The fifth anti-reflection pattern 177 covers the upper surface of the first gate electrode pattern 175. In exemplary embodiments, the fifth anti-reflection pattern 177 completely covers the first gate electrode pattern 175 so that the fifth anti-reflection pattern 177 does not expose the first gate electrode pattern 175, and the fifth anti-reflection pattern 177 is not formed on the gate insulation layer 150. In addition, the fifth anti-reflection pattern 177 consists essentially of graphene. Further, the fifth anti-reflection pattern 177 may have a single layer or a plurality of layers.

In this way, according to an embodiment, by performing a first selective etching deposition process, each of the first anti-refection pattern 172 and the fifth anti-reflection pattern 177 can be simultaneously formed on the upper surface of each of the gate electrode 170 and the first gate electrode pattern 175 without a patterning process.

Figure 6:
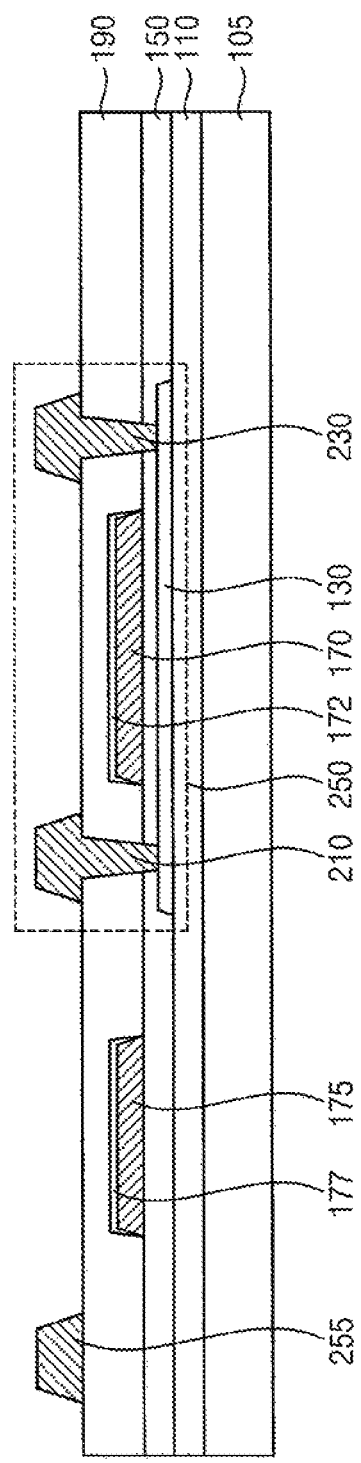

Referring to FIG. 6, according to an embodiment, an insulating interlayer 190 is formed on the first anti-reflection pattern 172 and the fifth anti-reflection pattern 177. The insulating interlayer 190 covers the first anti-reflection pattern 172 and the fifth anti-reflection pattern 177 on the gate insulation layer 150, and is formed on the entire gate insulation layer 150. In some embodiments, the insulating interlayer 190 is sufficiently thick to have a substantially flat upper surface without a step around the first and fifth anti-reflection patterns 172 and 177. Alternatively, in other embodiments, the insulating interlayer 190 has a substantially uniform thickness along a profile of the first and fifth anti-reflection patterns 172 and 177. The insulating interlayer 190 may be formed using a silicon compound, a metal oxide, etc.

According to an embodiment, a source electrode 210 and a drain electrode 230 are formed on the insulating interlayer 190. The source electrode 210 is in direct contact with a source region of the active layer 130 via a contact hole formed by removing a portion of the gate insulation layer 150 and the insulating interlayer 190. The drain electrode 230 is in direct contact with a drain region of the active layer 130 via a contact hole formed by removing another portion of the gate insulation layer 150 and the insulating interlayer 190. Each of the source electrode 210 and the drain electrode 230 is formed using a metal, an alloy, a metal nitride, a conductive metal oxide, a transparent conductive material, etc. These may be used alone or in a suitable combination thereof. In some exemplary embodiments, each of the source and drain electrodes 210 and 230 has a multi-layered structure. Accordingly, a semiconductor element 250 that includes the active layer 130, the gate insulation layer 150, the gate electrode 170, the insulating interlayer 190, the source electrode 210, and the drain electrode 230 is formed.

According to an embodiment, an electrode pattern 255 is formed on the insulating interlayer 190, and is spaced apart, from the source electrode 210 and the drain electrode 230. In exemplary embodiments, the electrode pattern 255, the source electrode 210, and the drain electrode 230 are disposed at the same layer, and are simultaneously formed using the same materials. For example, after a preliminary electrode layer is formed on the entire insulating interlayer 190, the source electrode 210, the drain electrode 230, and the electrode pattern 255 are formed by selectively etching the preliminary electrode. The electrode pattern 255 may be formed using a metal, a metal alloy, a metal nitride, a conductive metal oxide, a transparent conductive material, etc. These may be used alone or in a suitable combination thereof. In some exemplary embodiments, the electrode pattern 255 has a multi-layered structure.

Figure 7:
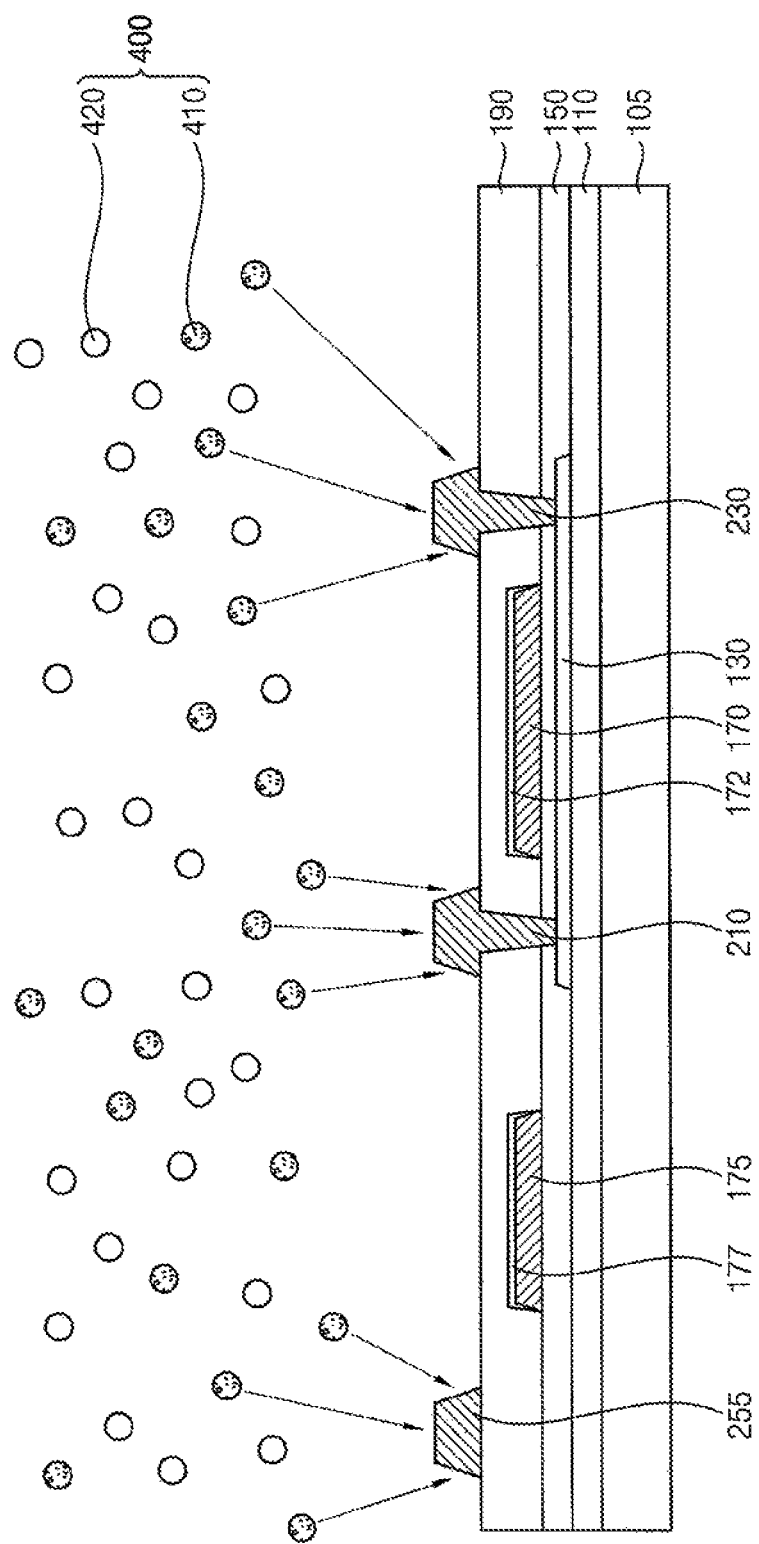

Referring to FIG. 7, according to an embodiment, a second selective etching deposition process is performed. For example, a heat treatment process is performed in the chamber on the source electrode 210, the drain electrode 230, and the electrode pattern 255, and the source electrode 210, the drain electrode 230, and the electrode pattern 255 are catalytic metals. The gas 400 includes the first material 410 and the second material 420 and is injected in the chamber at the same time as the heat treatment process. In exemplary embodiments, the first material 410 includes methane $CH_4$ and the second material 420 includes hydrogen $H_2$. After the gas 400 is injected into the chamber, the first material 410 and the second material 420 react in the chamber after which carbon is deposited on the catalytic metal. A second graphene layer is formed on an upper surface, such as an upper portion and both lateral portions of the source electrode 210, and a third graphene layer is formed on an upper surface, such as an upper portion and both lateral portions of the drain electrode 230. In addition, a sixth graphene layer is formed on an upper surface, such as an upper portion and both lateral portions of the electrode pattern 255.

Figure 8:
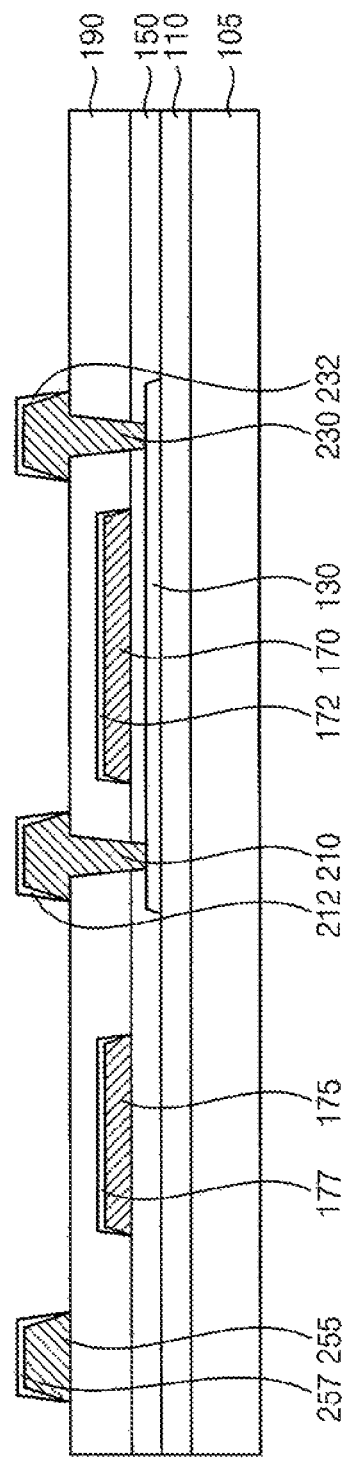

Referring to FIG. 8, according to an embodiment, a second anti-reflection pattern 212 is firmed on the source electrode 210. The second graphene layer is the second anti-reflection pattern 212. The second anti-reflection pattern 212 covers the upper surface of the source electrode 210. In exemplary embodiments, the second anti-reflection pattern 12 completely covers the source electrode 210 so that the second anti-reflection pattern 212 does not expose the source electrode 210, and the second anti-reflection pattern 212 is not formed on the insulating interlayer 190. In addition, the second anti-reflection pattern 212 consists essentially of graphene. Further, the second anti-reflection pattern 212 may have a single layer or a plurality of layers.

According to an embodiment, a third anti-reflection pattern 232 is formed on the drain electrode 230. The third graphene layer is the third anti-refection pattern 232. The third anti-reflection pattern 232 covers the upper surface of the drain electrode 230. In exemplary embodiments, the third anti-reflection pattern 232 completely covers the drain electrode 230 so that the third anti-reflection pattern 232 does not expose the drain electrode 230, and the third anti-reflection pattern 232 is not formed on the insulating, interlayer 190. In addition, the third anti-reflection pattern 232 consists essentially of graphene. Further, the third anti-reflection pattern 232 may have a single layer or a plurality of layers.

According to an embodiment, a sixth anti-reflection pattern 257 is formed on the electrode pattern 255. The sixth graphene layer is the sixth anti-reflection pattern 257. The sixth anti-reflection pattern 257 covers the upper surface of the electrode pattern 255. In exemplary embodiments, the sixth anti-reflection pattern 257 completely covers the electrode pattern 255 so that the sixth anti-reflection pattern 257 does not expose the electrode pattern 255, and the sixth anti-reflection pattern 257 is not formed on the insulating interlayer 190. In addition, the sixth anti-reflection pattern 257 consists essentially of graphene. Further, the sixth anti-reflection pattern 257 may have a single layer or a plurality of layers.

In this way, by performing the second selective etching deposition process, each of the second anti-reflection pattern 212, the third anti-reflection pattern 232, and the sixth anti-reflection pattern 257 can be simultaneously formed on the upper surface of each of the source electrode 210, the drain electrode 230, and the electrode pattern 255 without a patterning process.

Figure 9:
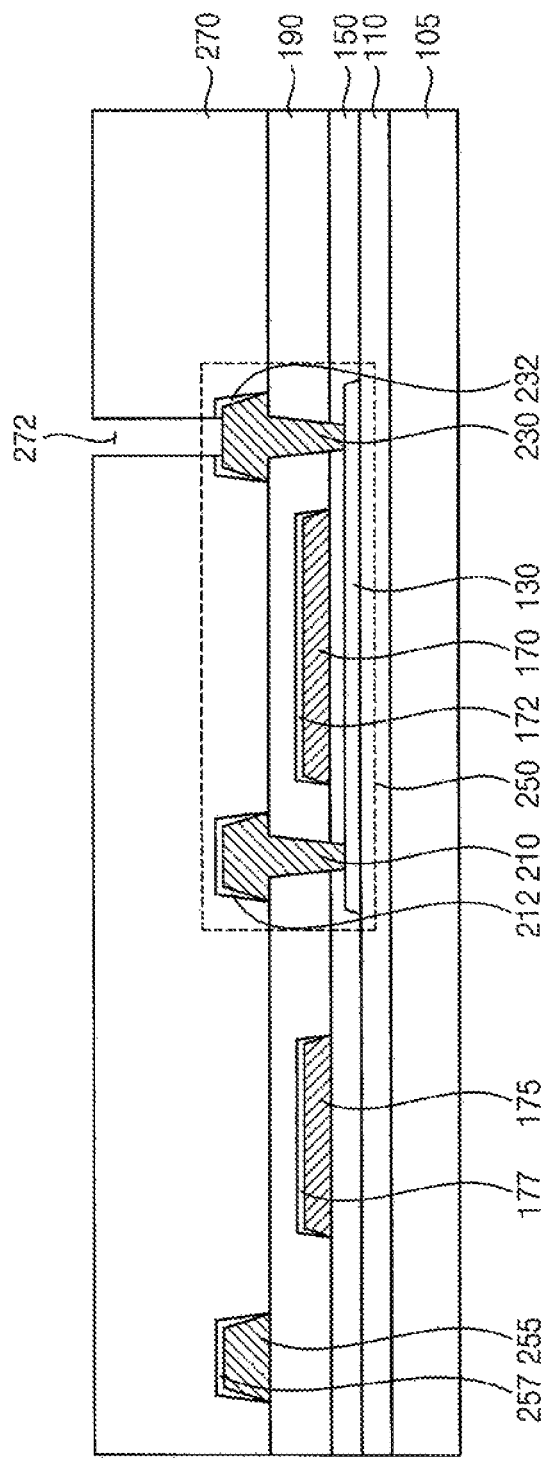

Referring to FIG. 9, according to an embodiment, a planarization layer 270 is formed on the second anti-reflection pattern 212, the third anti-reflection pattern 232, and the sixth anti-reflection pattern 257. The planarization layer 270 covers the second, third, and sixth anti-reflection patterns 212, 232, and 257, and is formed on the entire insulating interlayer 190. The planarization layer 270 is sufficiently thick to cover the second, third, and sixth anti-reflection patterns 212, 232, and 257 on the insulating interlayer 190. The planarization layer 270 has a substantially flat upper surface, and a planarization process is further performed on the planarization layer 270 to flatten upper surface of the planarization layer 270. After the planarization layer 270 is formed, a contact hole 272 is formed by removing a portion of the planarization layer 270. A portion of the upper surface of the drain electrode 230 is exposed via the contact hole 272. In this process, an opening that exposes a portion of the upper surface of the drain electrode 230 is formed in the third anti-reflection pattern 232 due to a contact hole 272. The planarization layer 270 may include organic materials or inorganic materials. In exemplary embodiments, the planarization layer 270 may be formed using organic materials such as polyimide, an epoxy-based resin, an acryl-based resin, polyester, a photoresist, a polyacryl-based resin, a polyimide-based resin, a polyamide-based resin, a siloxane-based resin, etc.

Figure 10:
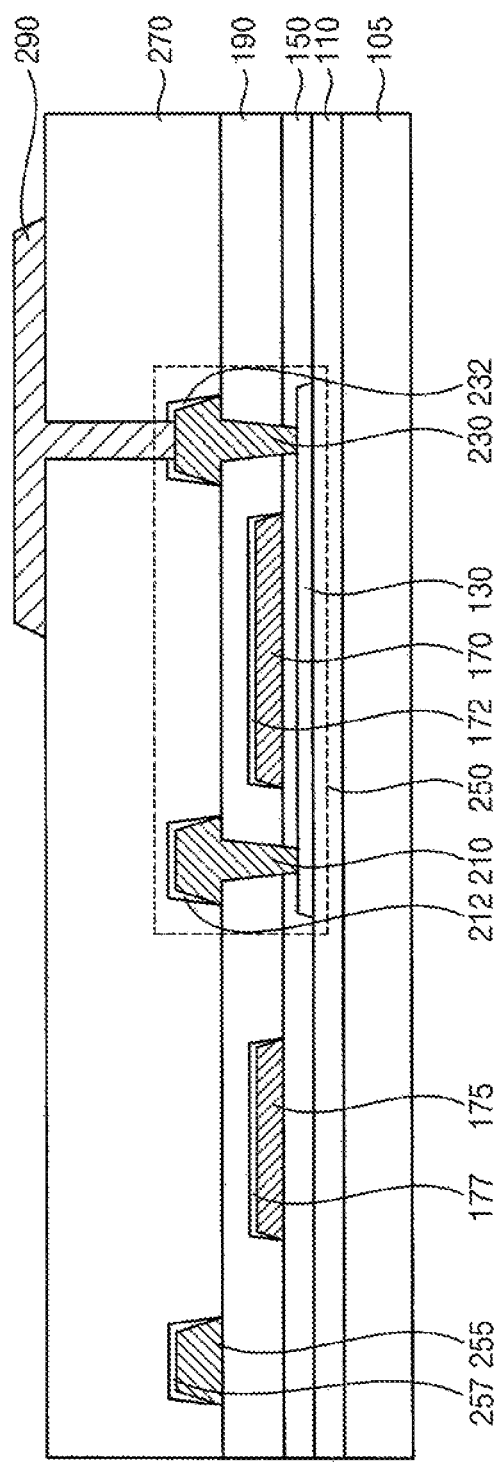

Referring to FIG. 10, according to an embodiment, a lower electrode 290 is formed on the planarization layer 270. The lower electrode 290 is formed on a portion of the planarization layer 270 under which the semiconductor element 250 is located, and is in contact with the drain electrode 230 via the contact hole 272 in the planarization layer 270. The lower electrode 290 may be formed using a metal, a metal alloy, a metal nitride, a conductive metal oxide, a transparent conductive material, etc. These may be used alone or in a suitable combination thereof. In some exemplary embodiments, the lower electrode 290 has a multi-layered structure.

Figure 11:
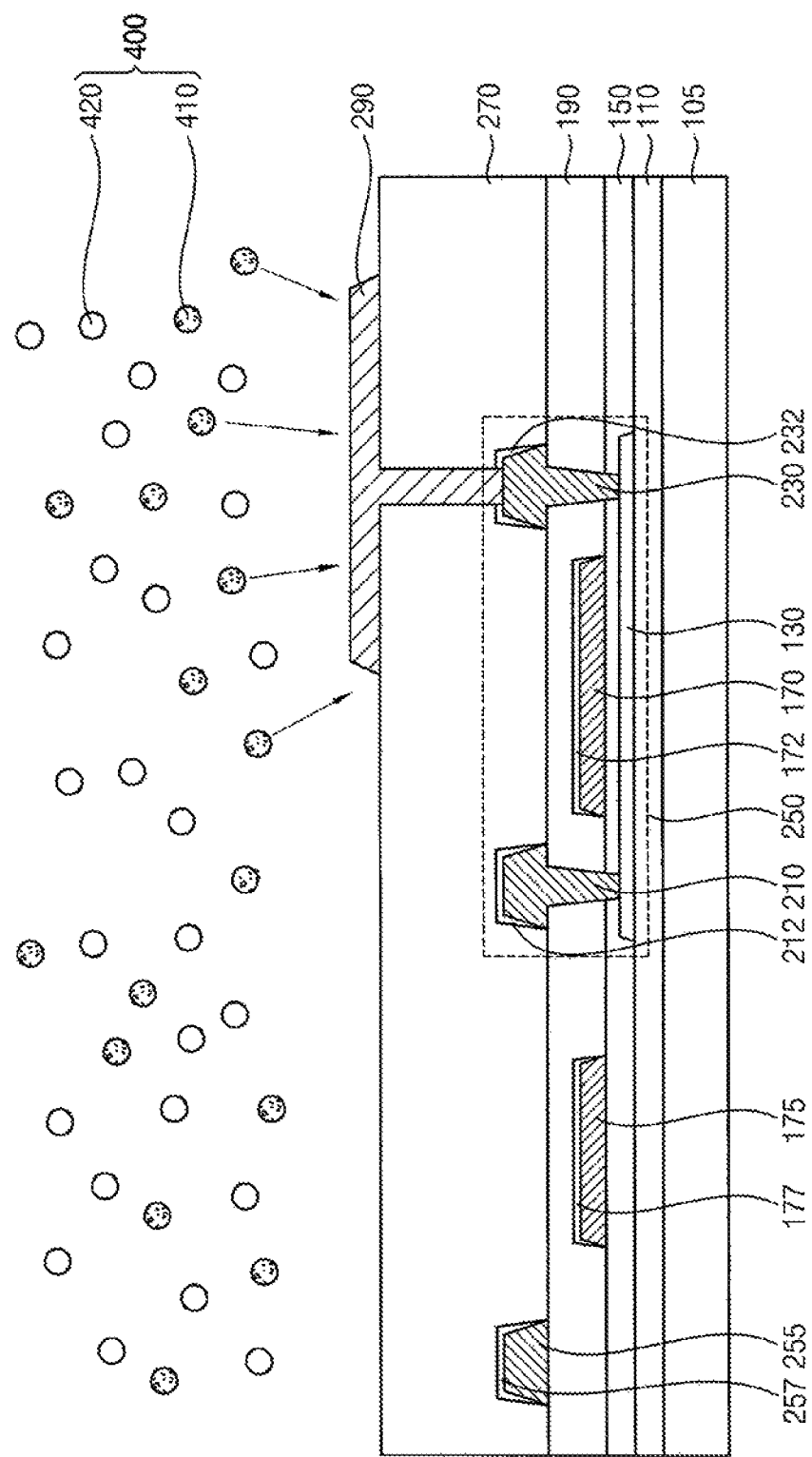

Referring to FIG. 11, according to an embodiment, a third selective etching deposition process is performed. For example, a heat treatment process is performed in the chamber on the lower electrode 290, and the lower electrode 290 is a catalytic metal. The gas 400 that includes the first material 410 and the second material 420 is injected into the chamber at the same time as the heat treatment process. In exemplary embodiments, the first material 410 includes methane $CH_4$ and the second material 420 includes hydrogen $H_2$. After the gas 400 is injected into the chamber, the first material 410 and the second material 420 react in the chamber after which carbon is deposited on the catalytic metal. A fourth graphene layer is formed on an upper surface, such as an upper portion and both lateral portions of the lower electrode 290.

Figure 12:
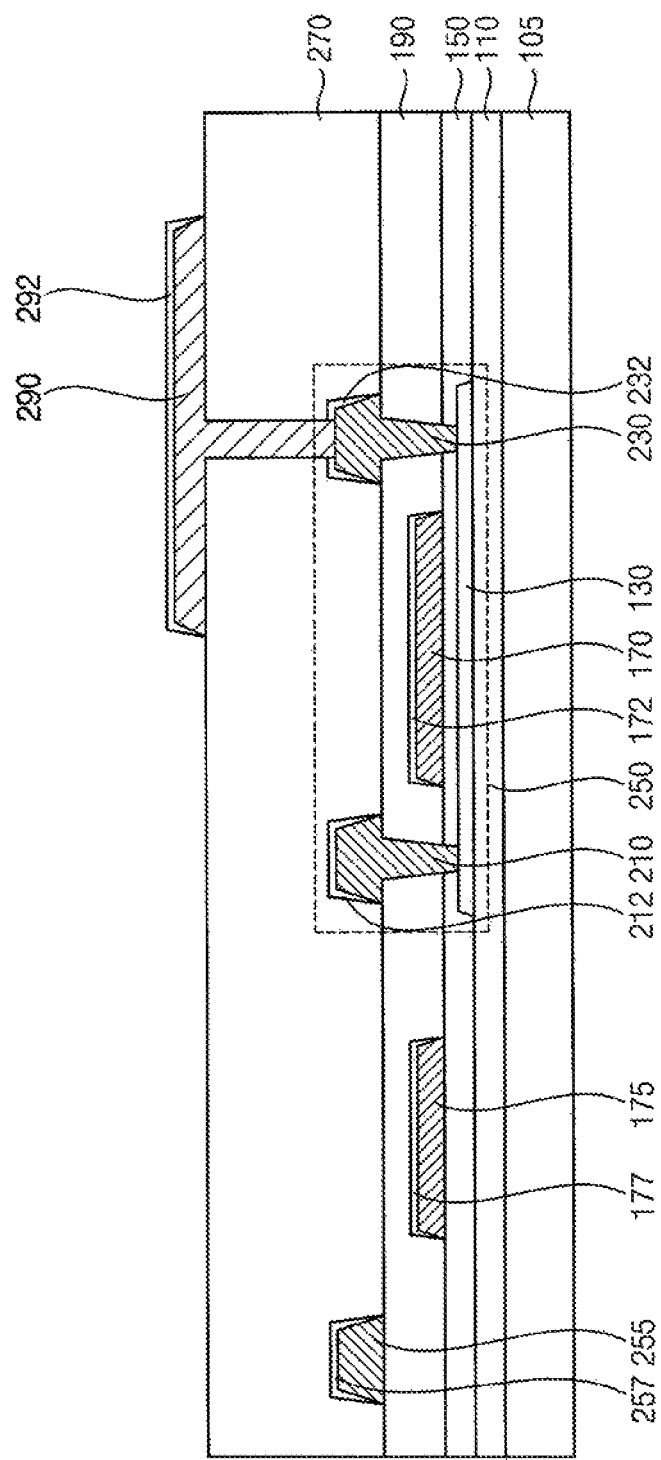

Referring to FIG. 12, according to an embodiment, a fourth anti-reflection pattern 292 is formed on the lower electrode 290. The fourth graphene layer is the fourth anti-reflection pattern 292. The fourth anti-reflection pattern 292 covers the upper surface of the lower electrode 290. In exemplary embodiments, the fourth anti-reflection pattern 292 completely covers the lower electrode 290 so that the fourth anti-reflection pattern 292 does not expose the lower electrode 290, and the fourth anti-reflection pattern 292 is not formed on the planarization layer 270. In addition, the fourth anti-reflection pattern 292 consists essentially of graphene. Further, the fourth anti-reflection pattern 292 may have a single layer or a plurality of layers.

In this way, according to an embodiment, fourth anti-reflection pattern 292 is formed in the upper surface of the lower electrode 290 by performing the third selective etching deposition process, without a patterning process.

Figure 13:
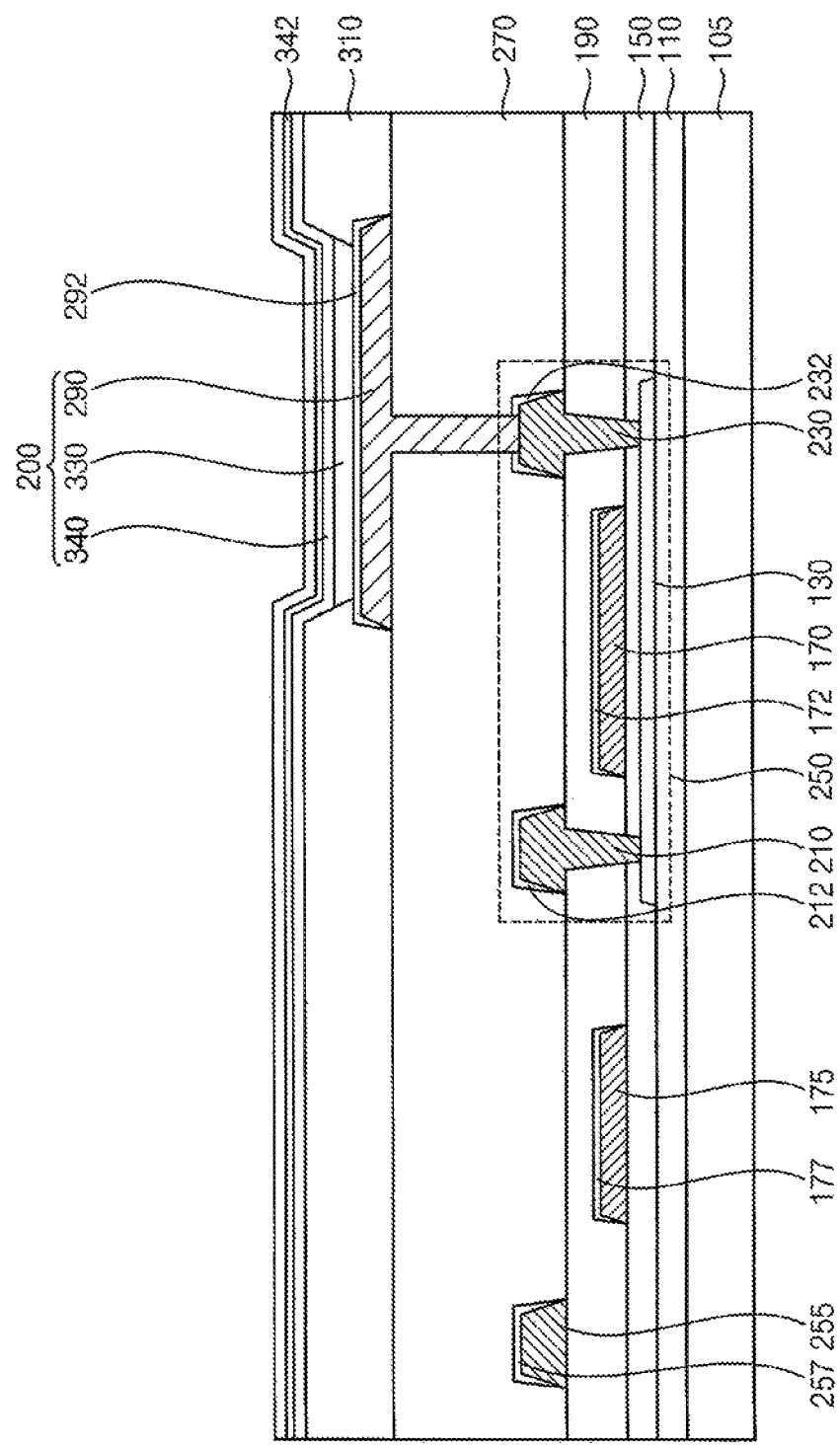

Referring to FIG. 13, according to an embodiment, a pixel defining layer 310 is formed on a portion of the fourth anti-reflection pattern 292 and the planarization layer 270, and covers both lateral portions of the fourth anti refection pattern 292 and exposes a portion of the fourth anti-reflection pattern 292. The pixel defining layer 310 may include organic materials or inorganic materials. In exemplary embodiments, the pixel defining layer 310 is formed using organic materials.

According to an embodiment, a light emitting layer 330 is formed on a portion of the fourth anti-reflection pattern 292 exposed by the pixel defining layer 310. According to some embodiments, the light emitting layer 330 is formed using at least one light emitting material that can generate different colors of light, such as red, blue, or green, etc., that correspond to different sub-pixels. Alternatively, according to other embodiments, the light emitting layer 330 generate white light by stacking a plurality of light emitting materials that can generate different colors of light, such as red, green, or blue. A color filter is formed on the light emitting layer 330. The color filter includes at least one of a red filter, a green filter, or a blue filter. Alternatively, according to still other embodiments, the color filter includes at least one of a yellow filter, a cyan filter, or a magenta filter. The color filters are formed using a photosensitive resin or a color photoresist, etc.

According to an embodiment, an upper electrode 340 is formed on the pixel defining layer 310 and the light emitting layer 330. The upper electrode 340 covers the light emitting layer 330 and the pixel defining layer 310, and is formed on the entire light emitting layer 330 and the entire pixel defining layer 310. The upper electrode 340 may be formed using a metal, a metal alloy, a metal nitride, a conductive metal oxide, a transparent conductive material, etc. These may be used alone or in a suitable combination thereof. In some exemplary embodiments, the upper electrode 340 has a multi-layered structure. Accordingly, a light emitting structure 200 that includes the lower electrode 290, the light emitting layer 330, and the upper electrode 340 is formed.

According to an embodiment, an anti-reflection layer 342 is formed on the upper electrode 340. The anti-reflection layer 342 covers an upper surface of the upper electrode 340, and is formed on the entire upper electrode 340. In other words, the anti-reflection layer 342 completely covers the upper electrode 340 so that the anti-reflection layer 342 does not expose the upper electrode 340. In exemplary embodiments, the anti-reflection layer 342 consists essentially of graphene, in addition, the graphene may have a single layer or a plurality of layers.

Figure 14:
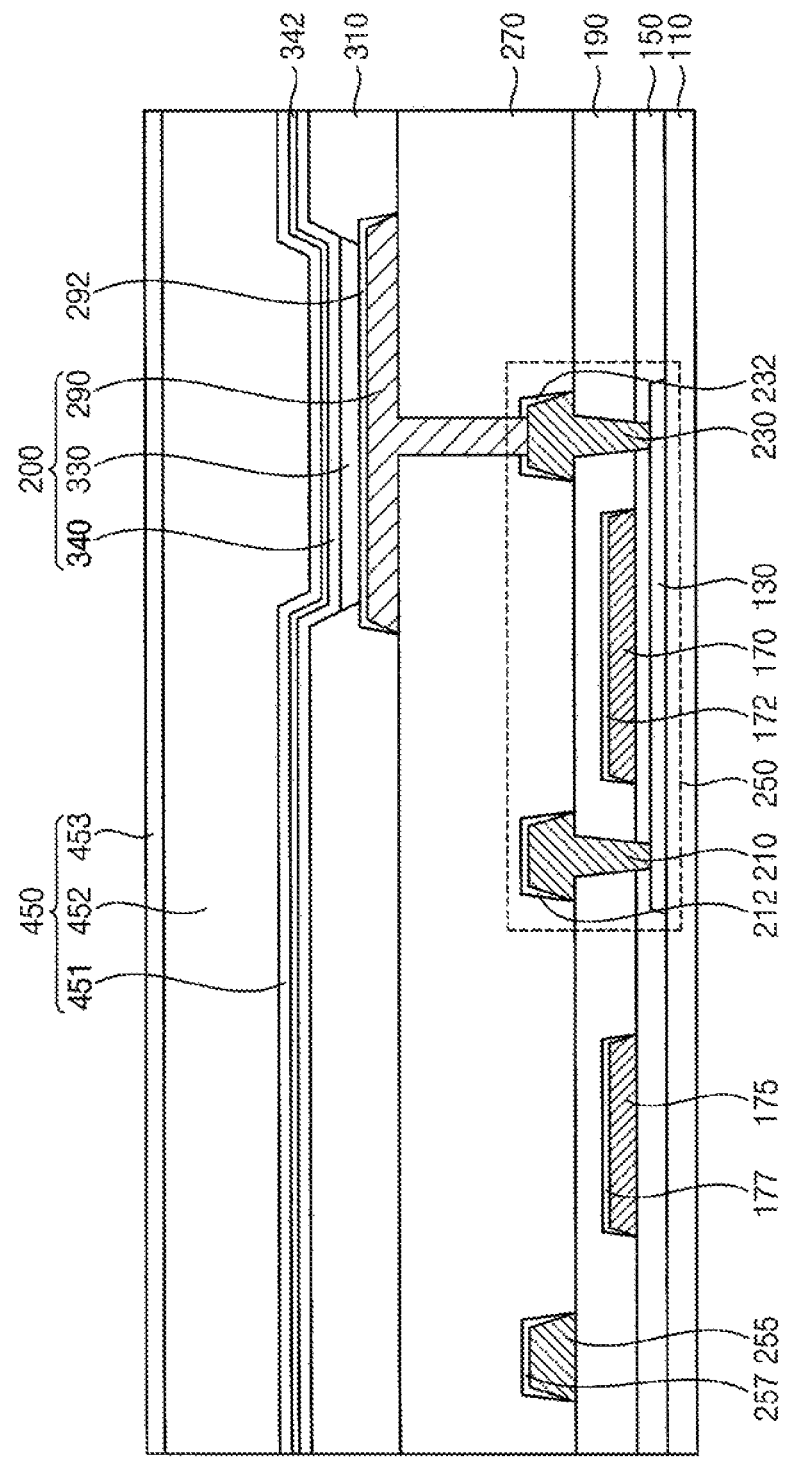

Referring to FIG. 14, according to an embodiment, a first TFE layer 451 is formed on the anti-reflection layer 342. The first TFE layer 451 covers the anti-reflection layer 342, and has a substantially uniform thickness along a profile of the anti-reflection layer 342. The first TFE layer 451 can prevent deterioration of the light emitting, structure 200 due to permeation of moisture, water, oxygen, etc. In addition, the first TFE layer 451 protects the light emitting structure 200 from external impacts. The first TFE layer 451 is formed from flexible inorganic materials.

According to an embodiment, a second TFE layer 452 is formed on the first TFE layer 451. The second TFE layer 452 improves the flatness of an OLED device, and protects the light emitting structure 200. The second TFE layer 452 is formed from flexible organic materials.

According to an embodiment, a third TFE layer 453 is formed on the second TFE layer 452. The third TFE layer 453 covers the second TFE layer 452, and has a substantially uniform thickness along a profile of the second TFE layer 452. The third TFE layer 453 together with the first TFE layer 451 and the second TFE layer 452 can prevent deterioration of the light emitting structure 200 due to the permeation of moisture, water, oxygen, etc. In addition, the third TFE layer 453 together with the first TFE layer 451 and the second TFE layer 452 protect the light emitting structure 200 from external impacts. The third TFE layer 453 is formed from flexible inorganic materials. Accordingly, a TFE structure 450 that includes the first TFE layer 451, the second TFE layer 452, and the third TFE layer 453 is formed, and an OLED device 100 illustrated in FIG. 1 can be manufactured.

In a method of manufacturing the OLED device in accordance with exemplary embodiments, as the first to sixth anti-reflection patterns 172, 217, 232, 292, 177, and 257 and the anti-reflection layer 342 are formed on a metal pattern without a patterning process, a manufacturing cost of the OLED device can be reduced.

Figure 15:
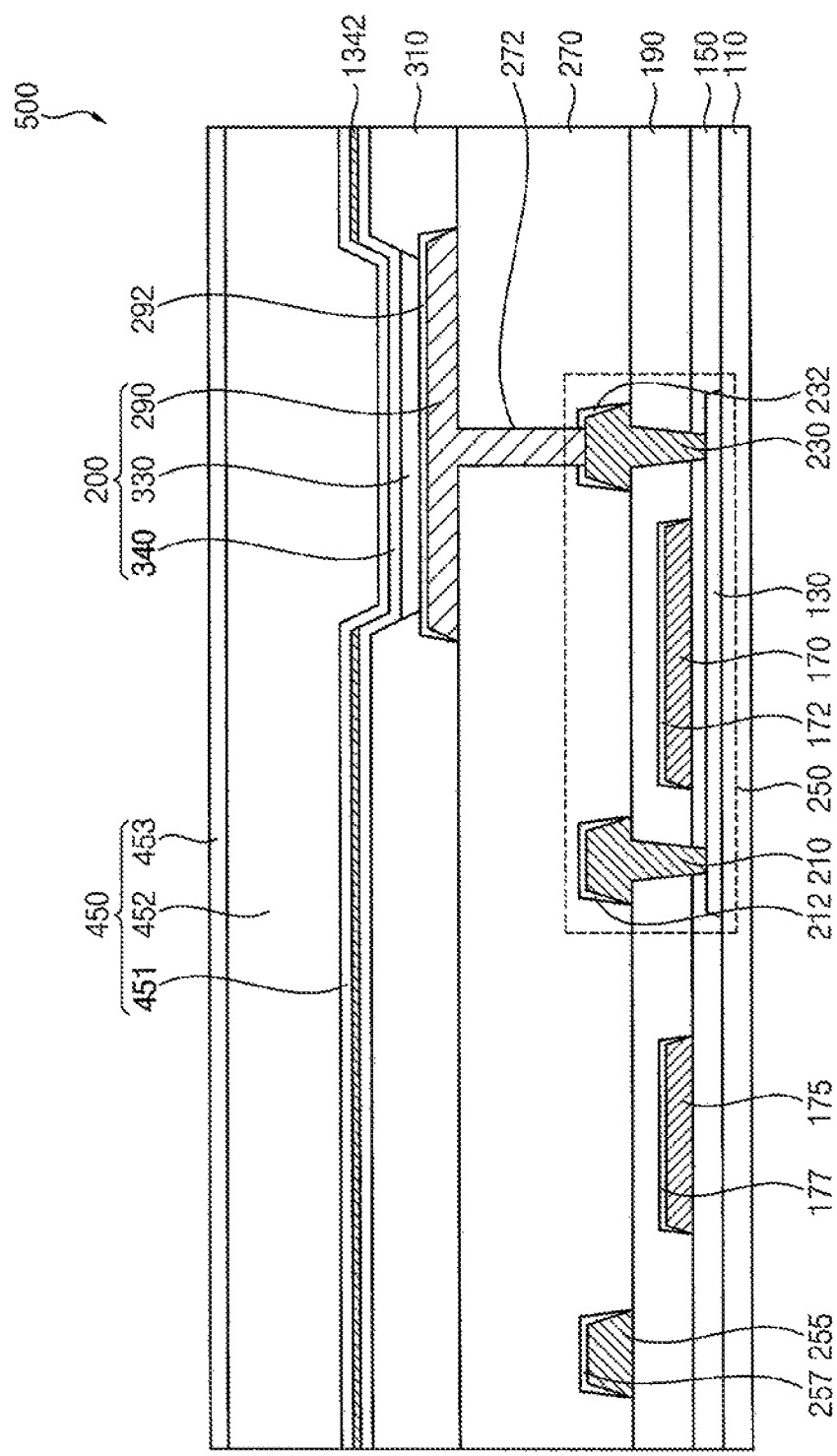
FIG. 15 is a cross-sectional view of an organic light emitting display device in accordance with exemplary embodiments.

FIG. 15 is a cross-sectional view illustrating an organic light emitting display device in accordance with exemplary embodiments. An OLED device 500 illustrated in FIG. 15 has substantially the same structure as an OLED device 100 described with reference to FIG. 1 except for a anti-reflection layer 1342. In FIG. 15, detailed descriptions for elements that are substantially the same as or similar to elements described with reference to FIG. 1 may be omitted.

Referring to FIG. 15, according to an embodiment, an OLED device 500 includes a substrate 110, a semiconductor element 250, a first anti-reflection pattern 172, a second anti-reflection pattern 212, a third anti-reflection pattern 232, a first gate electrode pattern 175, a fifth anti-reflection pattern 177, an electrode pattern 255, a sixth anti-reflection pattern 257, a planarization layer 270, a pixel defining layer 310, a light emitting structure 200, a fourth anti-reflection pattern 292, an anti-reflection layer 1342, a TFE structure 450, etc. As the OLED device 500 includes the first through sixth anti-reflection patterns 172, 212, 232, 292, 177, and 257 and the anti-reflection layer 1342, the OLED device 500 can reduce the reflection of external light.

According to an embodiment, the anti-reflection layer 1342 is disposed on the upper electrode 340. In exemplary embodiments, the anti-reflection layer 1342 has an opening that exposes the light emitting layer 330.

In this case, according to an embodiment, light is emitted outward from the light emitting layer 330 without change of the light path via the opening of the anti-reflection layer 1342. Accordingly, a visibility of the OLED device 500 can be improved.

Embodiments of the present disclosure can be incorporated into various display devices, such as an organic light emitting display device. For example, embodiments of the present disclosure can be incorporated into a vehicle-display device, a ship-display device, an aircraft-display device, a portable communication device, a display device for information transfer, a medical-display device, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An organic light emitting display (OLED) device, comprising:
   a semiconductor element disposed on a substrate;
   a lower electrode disposed on the semiconductor element;
   a light emitting layer disposed on the lower electrode;
   an upper electrode disposed on the light emitting layer;
   an anti-reflection layer disposed on the upper electrode, wherein the anti-reflection layer consists essentially of graphene; and
   a thin film encapsulation structure disposed on the anti-reflection layer.

2. The OLED device of claim 1, wherein the anti-reflection layer is disposed on the entire upper electrode.

3. The OLED device of claim 1, wherein the anti-reflection layer has an opening that exposes the light emitting layer.

4. The OLED device of claim 1, wherein the semiconductor element includes:
   an active layer disposed on the substrate;
   a gate electrode disposed on the active layer;
   source and drain electrodes disposed on the gate electrode,
   a gate insulation layer disposed between the active layer and the gate electrode; and
   an insulating interlayer disposed between the gate electrode and the source and drain electrodes.

5. The OLED device of claim 4, further comprising:
   a first anti-reflection pattern disposed on the gate electrode that covers an upper surface of the gate electrode, the first anti-reflection pattern being disposed on the upper surface of the gate electrode;
   a second anti-reflection pattern disposed on the source electrode that covers an upper surface of the source electrode, the second anti-reflection pattern being disposed on the upper surface of the source electrode; and
   a third anti-reflection pattern disposed on the drain electrode that covers an upper surface of the drain electrode, the third anti-reflection pattern being disposed on the upper surface of the drain electrode,
   wherein the first, second, and third anti-reflection patterns are not disposed on the gate insulation layer or the insulating interlayer.

6. The OLED device of claim 5, further comprising:
   a fourth anti-reflection pattern disposed on the lower electrode that covers an upper surface of the lower electrode, the fourth anti-reflection pattern being disposed on the upper surface of the lower electrode, and a planarization layer disposed between the semiconductor element and the lower electrode,
wherein the fourth anti-reflection pattern is not disposed on the planarization layer.

7. The OLED device of claim 6, wherein the lower electrode is in contact with the upper surface of the drain electrode via a contact hole formed by removing a portion of the planarization layer, and is electrically connected to the drain electrode, and
wherein the third anti-reflection pattern has an opening that exposes a portion of the upper surface of the drain electrode through the contact hole.

8. The OLED device of claim 7, wherein the first, second, third, and fourth anti-reflection patterns consist essentially of graphene.

9. The OLED device of claim 4, further comprising:
a first gate electrode pattern disposed at the same layer as the gate electrode, the first gate electrode pattern being spaced apart from the gate electrode;
a fifth anti-reflection pattern disposed on the first gate electrode pattern that covers an upper surface of the first gate electrode pattern, the fifth anti-reflection pattern being disposed only on the upper surface of the first gate electrode pattern;
an electrode pattern disposed at the same layer as the source and drain electrodes, the electrode pattern being spaced apart from the source and drain electrodes; and
a sixth anti-reflection pattern disposed on the electrode pattern that covers an upper surface of the electrode pattern, the sixth anti-reflection pattern being disposed only on the upper surface of the electrode pattern.

10. The OLED device of claim 1, wherein the thin film encapsulation structure includes:
a first thin film encapsulation layer disposed on the anti-reflection layer, the first thin film encapsulation layer including inorganic materials;
a second thin film encapsulation layer disposed on the first thin film encapsulation layer, the second thin film encapsulation layer including organic materials; and
a third thin film encapsulation layer disposed on the second thin film encapsulation layer, the third thin film encapsulation layer including inorganic materials.

11. The OLED device of claim 10, wherein the substrate and the thin film encapsulation structure include flexible materials.

12. An organic light emitting display (OLED) device, comprising:
a semiconductor element disposed on a substrate;
a planarization layer disposed on the semiconductor element
a lower electrode disposed on the planarization layer;
a fourth anti-reflection pattern disposed on the lower electrode that covers an upper surface of the lower electrode, the fourth anti-reflection pattern being disposed on the upper surface of the lower electrode, wherein the fourth anti-reflection pattern is not disposed on the planarization layer, wherein the fourth anti-reflection pattern consists essentially of graphene;
a light emitting layer disposed on the fourth anti-reflection pattern; and
an upper electrode disposed on the light emitting layer.

13. The OLED device of claim 12, wherein the semiconductor element includes:
an active layer disposed on the substrate;
a gate electrode disposed on the active layer;
source and drain electrodes disposed on the gate electrode;
a gate insulation layer disposed between the active layer and the gate electrode;
an insulating interlayer disposed between the gate electrode and the source and drain electrodes;
a first anti-reflection pattern disposed on the gate electrode that covers an upper surface of the gate electrode, the first anti-reflection pattern being disposed only on the upper surface of the gate electrode;
a second anti-reflection pattern disposed on the source electrode that covers an upper surface of the source electrode, the second anti-reflection pattern being disposed only on the upper surface of the source electrode; and
a third anti-reflection pattern disposed on the drain electrode that covers an upper surface of the drain electrode, the third anti-reflection pattern being disposed only on the upper surface of the drain electrode,
wherein the first, second, and third anti-reflection patterns are not disposed on the gate insulation layer or the insulating interlayer, and the first, second, and third anti-reflection patterns consist essentially of graphene.

14. The OLED device of claim 13, further comprising:
a first gate electrode pattern disposed at the same layer as the gate electrode, the first gate electrode pattern being spaced apart from the gate electrode;
a fifth anti-reflection pattern disposed on the first gate electrode pattern that covers an upper surface of the first gate electrode pattern, the fifth anti-reflection pattern being disposed only on the upper surface of the first gate electrode pattern;
an electrode pattern disposed at the same layer as the source and drain electrodes, the electrode pattern being spaced apart from the source and drain electrodes;
a sixth anti-reflection pattern disposed on the electrode pattern that covers an upper surface of the electrode pattern, the sixth anti-reflection pattern being disposed only on the upper surface of the electrode pattern; and
an anti-reflection layer on the upper electrode,
wherein the fifth and sixth anti-reflection patterns and the anti-reflection layer consist essentially of graphene.

* * * * *